US012568843B2

(12) United States Patent
Koduri et al.

(10) Patent No.: US 12,568,843 B2
(45) Date of Patent: Mar. 3, 2026

(54) FILM COVERS FOR SENSOR PACKAGES

(71) Applicant: TEXAS INSTRUMENTS INCORPORATED, Dallas, TX (US)

(72) Inventors: Sreenivasan Kalyani Koduri, Dallas, TX (US); Leslie Edward Stark, Heath, TX (US); Steven Alfred KummerlL, Carrollton, TX (US); Wai Lee, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/618,843

(22) Filed: Mar. 27, 2024

(65) Prior Publication Data

US 2024/0243024 A1     Jul. 18, 2024

Related U.S. Application Data

(60) Continuation of application No. 18/299,293, filed on Apr. 12, 2023, now Pat. No. 11,972,994, which is a division of application No. 17/116,963, filed on Dec. 9, 2020, now Pat. No. 11,658,083.

(51) Int. Cl.
| | |
|---|---|
| *H01L 23/31* | (2006.01) |
| *H01L 21/56* | (2006.01) |
| *H01L 23/00* | (2006.01) |
| *H01L 23/14* | (2006.01) |
| *H01L 23/29* | (2006.01) |
| *H01L 25/065* | (2023.01) |

(52) U.S. Cl.
CPC ............ *H01L 23/31* (2013.01); *H01L 21/565* (2013.01); *H01L 23/142* (2013.01); *H01L 23/293* (2013.01); *H01L 23/564* (2013.01); *H01L 25/0655* (2013.01)

(58) Field of Classification Search
CPC ..... H01L 23/31; H01L 23/142; H01L 23/293; H01L 23/564; H01L 21/565; H01L 25/0655
See application file for complete search history.

(56) References Cited

U.S. PATENT DOCUMENTS

| | | | |
|---|---|---|---|
| 4,894,707 A | 1/1990 | Yavmawaki et al. | |
| 5,644,169 A * | 7/1997 | Chun .................... | H01L 21/565 257/710 |
| 5,897,338 A * | 4/1999 | Kaldenberg .......... | H01L 21/565 216/33 |
| 6,117,705 A | 9/2000 | Glenn | |
| 6,905,910 B1 | 6/2005 | Shiu | |
| 7,026,710 B2 | 4/2006 | Coyle et al. | |
| 7,576,401 B1 * | 8/2009 | de Guzman .......... | H10F 39/024 257/E31.127 |

(Continued)

*Primary Examiner* — Peniel M Gumedzoe

(74) *Attorney, Agent, or Firm* — Xiaotun Qiu; Frank D. Cimino

(57) ABSTRACT

In some examples, a sensor package includes a semiconductor die having a sensor; a mold compound covering a portion of the semiconductor die; and a cavity formed in a top surface of the mold compound, the sensor being in the cavity. The sensor package includes an adhesive abutting the top surface of the mold compound, and a semi-permeable film abutting the adhesive and covering the cavity. The semi-permeable film is approximately flush with at least four edges of the top surface of the mold compound.

15 Claims, 30 Drawing Sheets

(56) References Cited

U.S. PATENT DOCUMENTS

| | | | |
|---|---|---|---|
| 7,939,901 | B2 | 5/2011 | Minamio et al. |
| 9,448,130 | B2 | 9/2016 | Vaupel et al. |
| 2007/0176274 | A1 | 8/2007 | Yoneda |
| 2012/0228756 | A1 | 9/2012 | Kolleth et al. |
| 2015/0226810 | A1 | 8/2015 | Elian et al. |
| 2017/0218236 | A1 | 8/2017 | Matsukawa et al. |

* cited by examiner

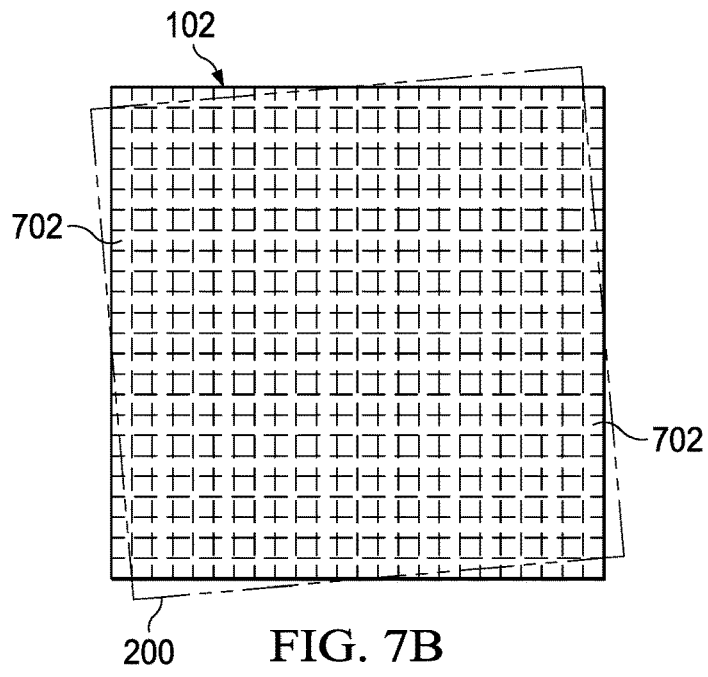
102
702
702
200
FIG. 7B
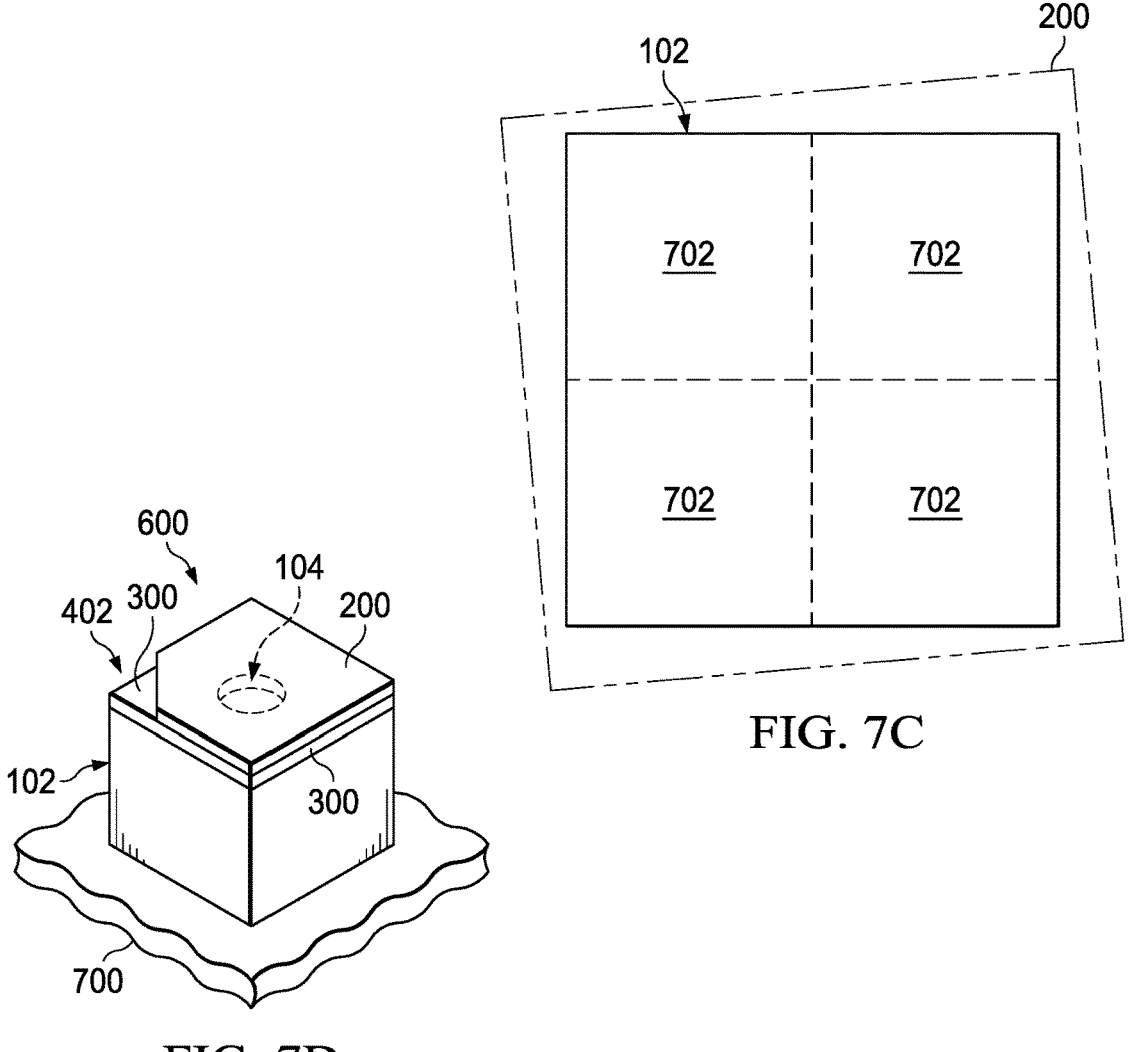
200
102
702       702
702       702
FIG. 7C
600
402  300  104  200
102
300
700
FIG. 7D

2100

2200

2004

2000

2002

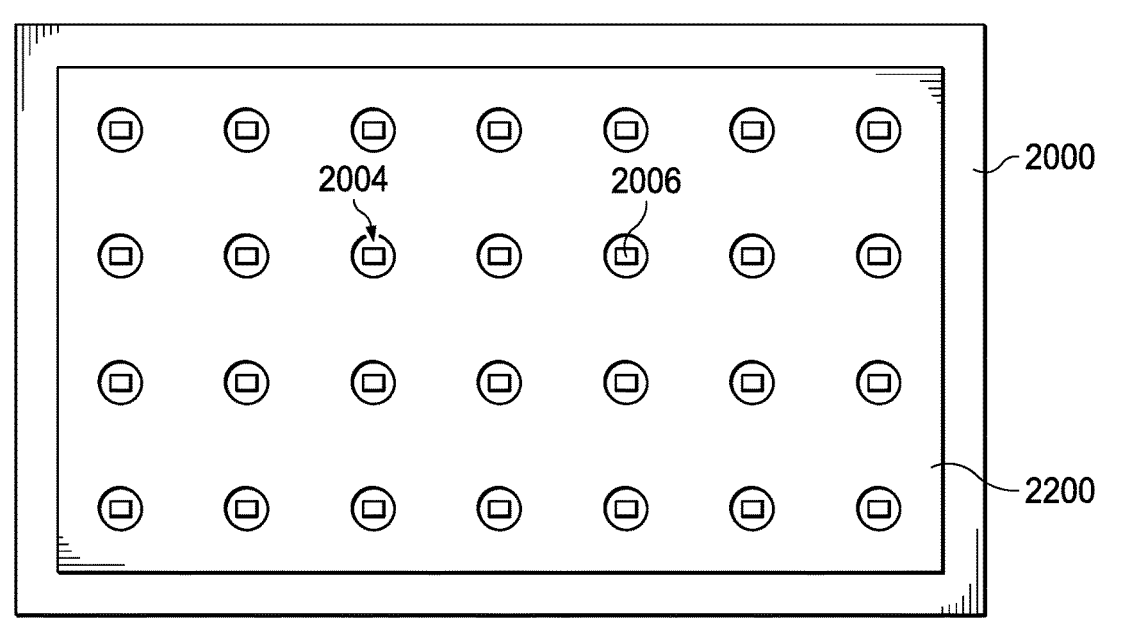
FIG. 22B
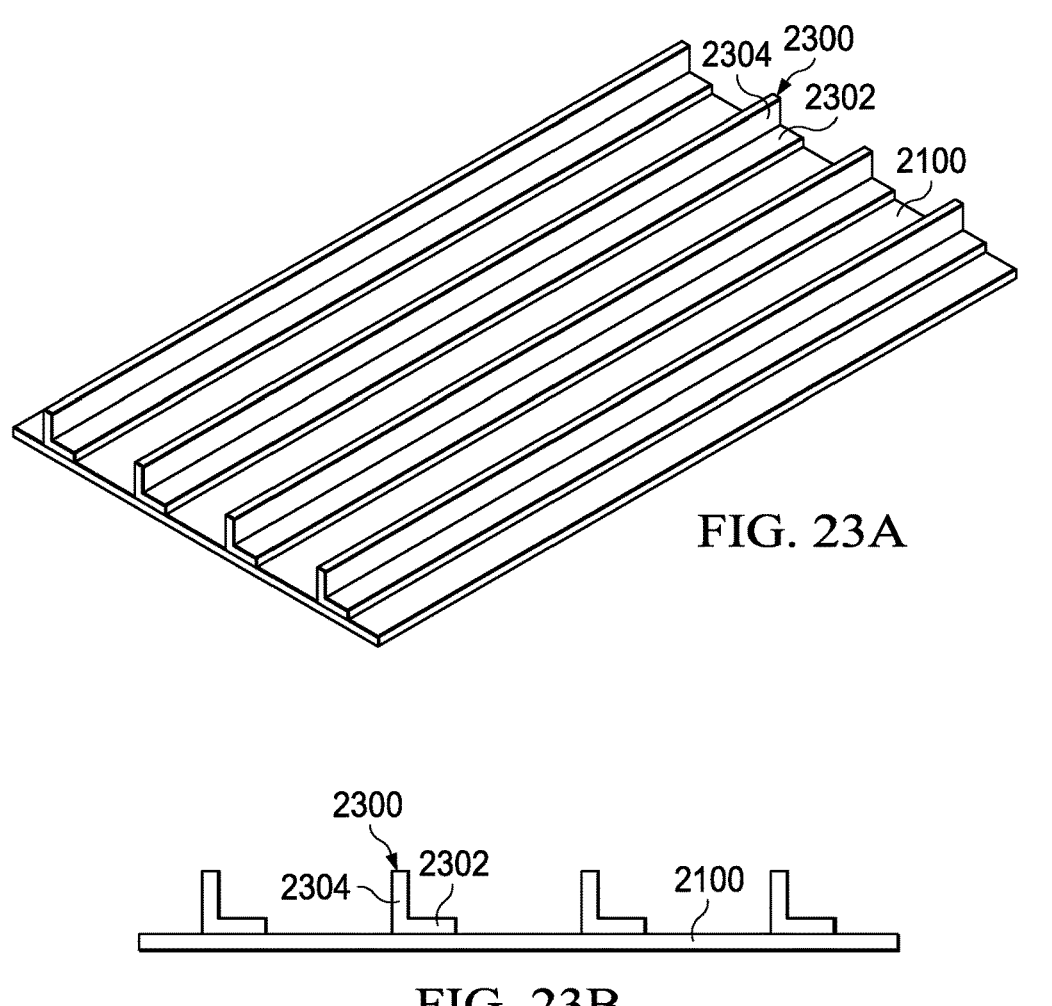
FIG. 23A
FIG. 23B

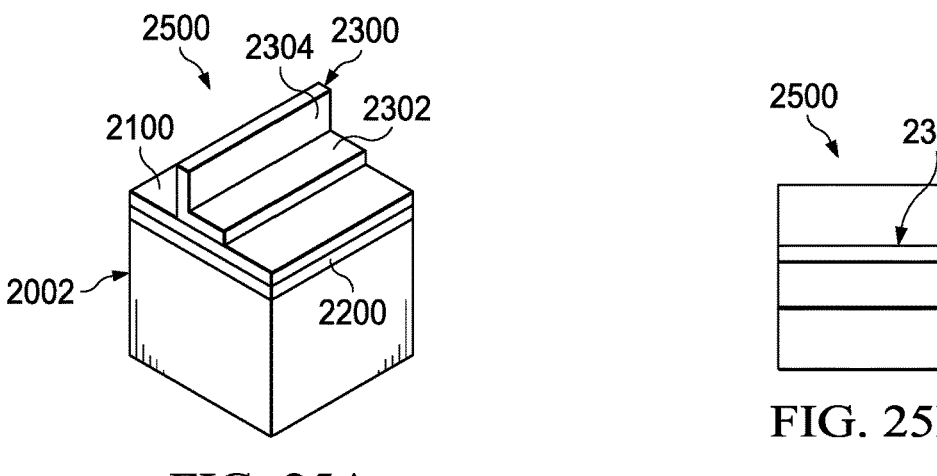
FIG. 25A
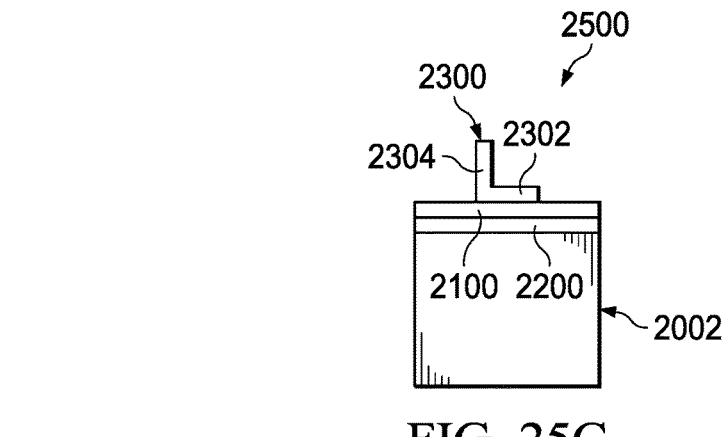
FIG. 25B
FIG. 25C
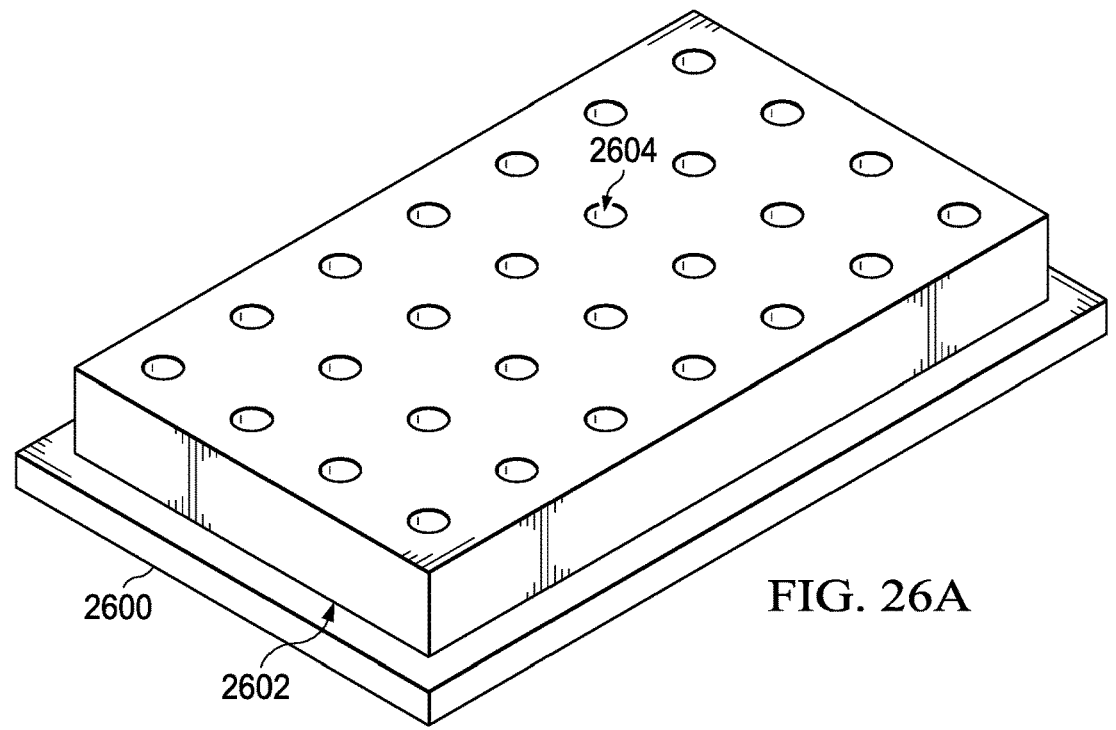
FIG. 26A

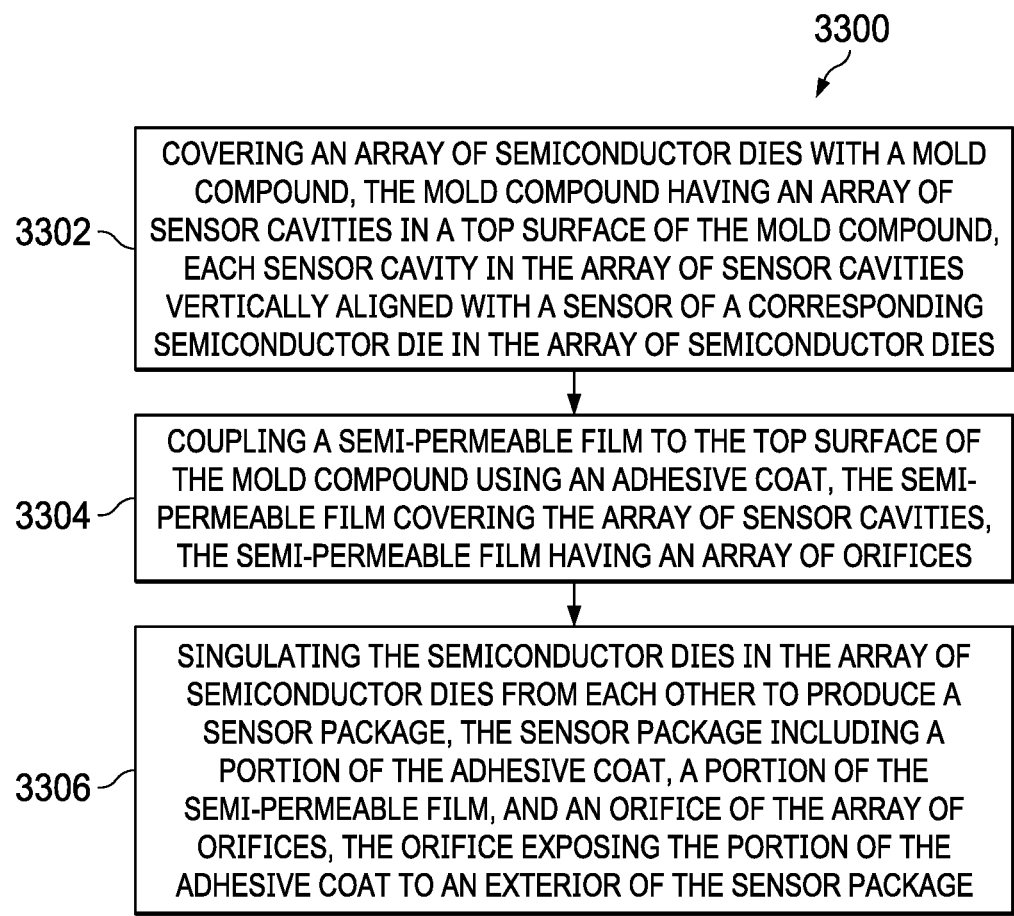

3300

3302 — COVERING AN ARRAY OF SEMICONDUCTOR DIES WITH A MOLD COMPOUND, THE MOLD COMPOUND HAVING AN ARRAY OF SENSOR CAVITIES IN A TOP SURFACE OF THE MOLD COMPOUND, EACH SENSOR CAVITY IN THE ARRAY OF SENSOR CAVITIES VERTICALLY ALIGNED WITH A SENSOR OF A CORRESPONDING SEMICONDUCTOR DIE IN THE ARRAY OF SEMICONDUCTOR DIES

3304 — COUPLING A SEMI-PERMEABLE FILM TO THE TOP SURFACE OF THE MOLD COMPOUND USING AN ADHESIVE COAT, THE SEMI-PERMEABLE FILM COVERING THE ARRAY OF SENSOR CAVITIES, THE SEMI-PERMEABLE FILM HAVING AN ARRAY OF ORIFICES

3306 — SINGULATING THE SEMICONDUCTOR DIES IN THE ARRAY OF SEMICONDUCTOR DIES FROM EACH OTHER TO PRODUCE A SENSOR PACKAGE, THE SENSOR PACKAGE INCLUDING A PORTION OF THE ADHESIVE COAT, A PORTION OF THE SEMI-PERMEABLE FILM, AND AN ORIFICE OF THE ARRAY OF ORIFICES, THE ORIFICE EXPOSING THE PORTION OF THE ADHESIVE COAT TO AN EXTERIOR OF THE SENSOR PACKAGE

FIG. 33

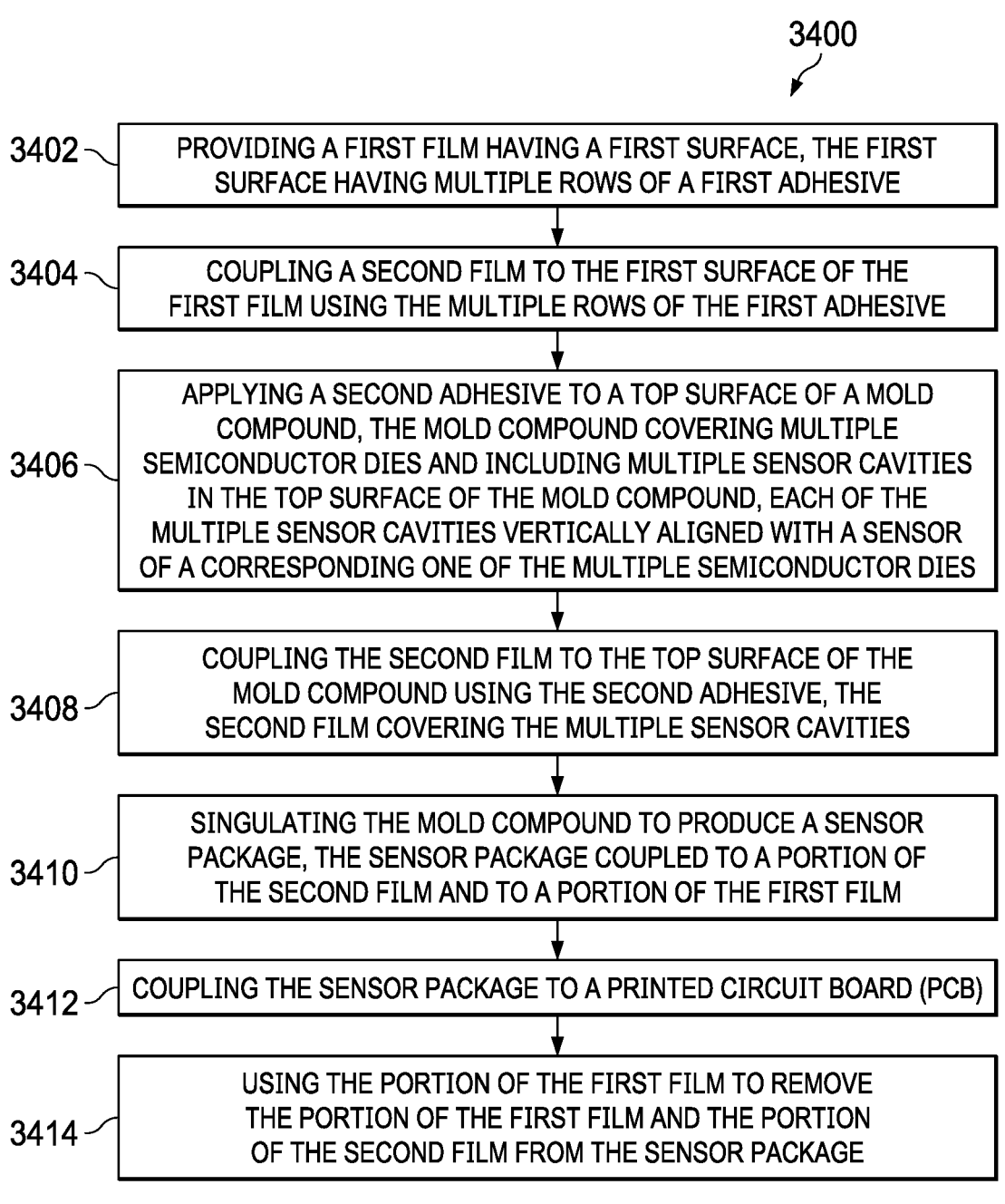

3400

3402 — PROVIDING A FIRST FILM HAVING A FIRST SURFACE, THE FIRST SURFACE HAVING MULTIPLE ROWS OF A FIRST ADHESIVE

3404 — COUPLING A SECOND FILM TO THE FIRST SURFACE OF THE FIRST FILM USING THE MULTIPLE ROWS OF THE FIRST ADHESIVE

3406 — APPLYING A SECOND ADHESIVE TO A TOP SURFACE OF A MOLD COMPOUND, THE MOLD COMPOUND COVERING MULTIPLE SEMICONDUCTOR DIES AND INCLUDING MULTIPLE SENSOR CAVITIES IN THE TOP SURFACE OF THE MOLD COMPOUND, EACH OF THE MULTIPLE SENSOR CAVITIES VERTICALLY ALIGNED WITH A SENSOR OF A CORRESPONDING ONE OF THE MULTIPLE SEMICONDUCTOR DIES

3408 — COUPLING THE SECOND FILM TO THE TOP SURFACE OF THE MOLD COMPOUND USING THE SECOND ADHESIVE, THE SECOND FILM COVERING THE MULTIPLE SENSOR CAVITIES

3410 — SINGULATING THE MOLD COMPOUND TO PRODUCE A SENSOR PACKAGE, THE SENSOR PACKAGE COUPLED TO A PORTION OF THE SECOND FILM AND TO A PORTION OF THE FIRST FILM

3412 — COUPLING THE SENSOR PACKAGE TO A PRINTED CIRCUIT BOARD (PCB)

3414 — USING THE PORTION OF THE FIRST FILM TO REMOVE THE PORTION OF THE FIRST FILM AND THE PORTION OF THE SECOND FILM FROM THE SENSOR PACKAGE

FIG. 34

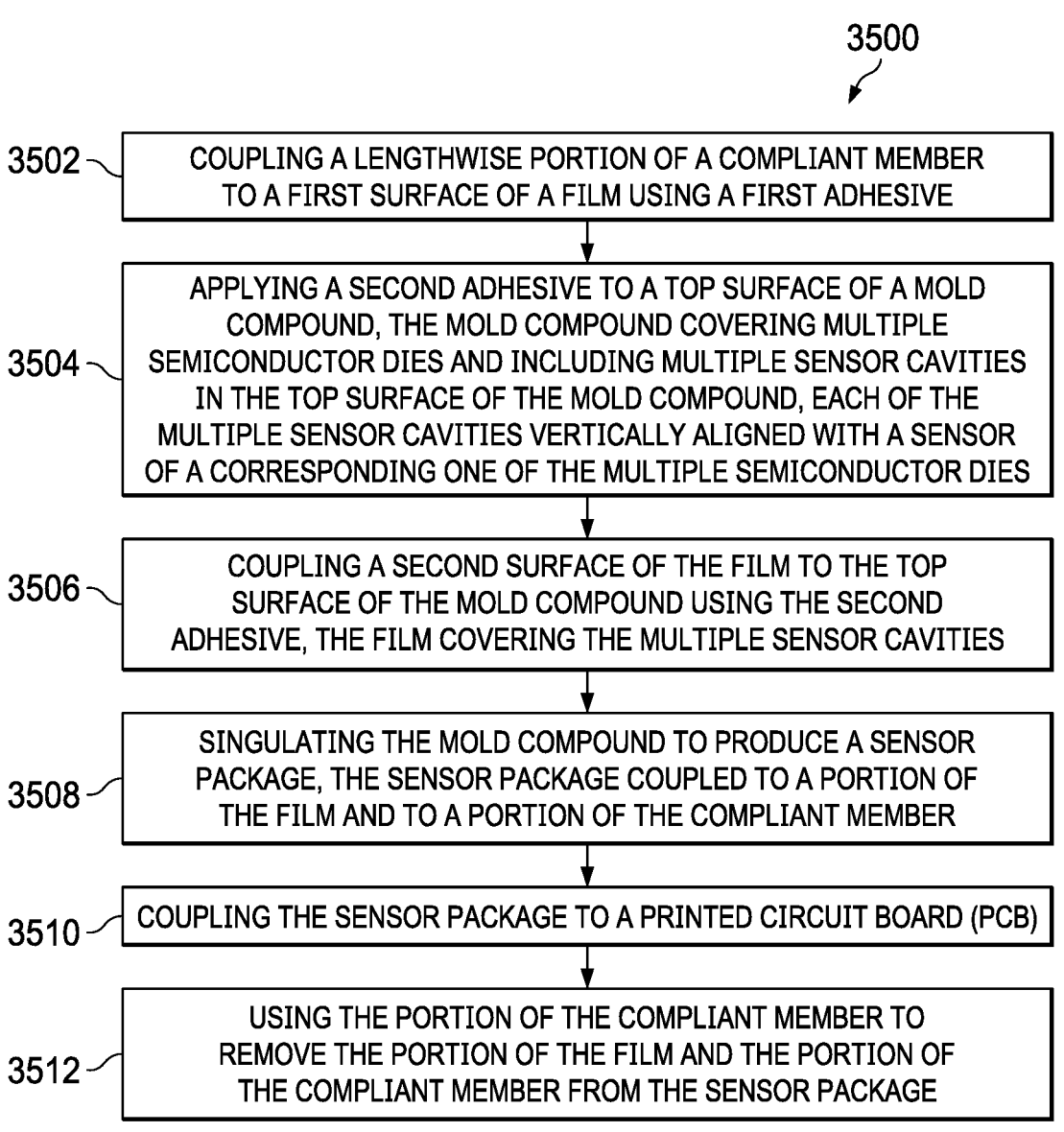

3500

| 3502 | COUPLING A LENGTHWISE PORTION OF A COMPLIANT MEMBER TO A FIRST SURFACE OF A FILM USING A FIRST ADHESIVE |

| 3504 | APPLYING A SECOND ADHESIVE TO A TOP SURFACE OF A MOLD COMPOUND, THE MOLD COMPOUND COVERING MULTIPLE SEMICONDUCTOR DIES AND INCLUDING MULTIPLE SENSOR CAVITIES IN THE TOP SURFACE OF THE MOLD COMPOUND, EACH OF THE MULTIPLE SENSOR CAVITIES VERTICALLY ALIGNED WITH A SENSOR OF A CORRESPONDING ONE OF THE MULTIPLE SEMICONDUCTOR DIES |

| 3506 | COUPLING A SECOND SURFACE OF THE FILM TO THE TOP SURFACE OF THE MOLD COMPOUND USING THE SECOND ADHESIVE, THE FILM COVERING THE MULTIPLE SENSOR CAVITIES |

| 3508 | SINGULATING THE MOLD COMPOUND TO PRODUCE A SENSOR PACKAGE, THE SENSOR PACKAGE COUPLED TO A PORTION OF THE FILM AND TO A PORTION OF THE COMPLIANT MEMBER |

| 3510 | COUPLING THE SENSOR PACKAGE TO A PRINTED CIRCUIT BOARD (PCB) |

| 3512 | USING THE PORTION OF THE COMPLIANT MEMBER TO REMOVE THE PORTION OF THE FILM AND THE PORTION OF THE COMPLIANT MEMBER FROM THE SENSOR PACKAGE |

FIG. 35

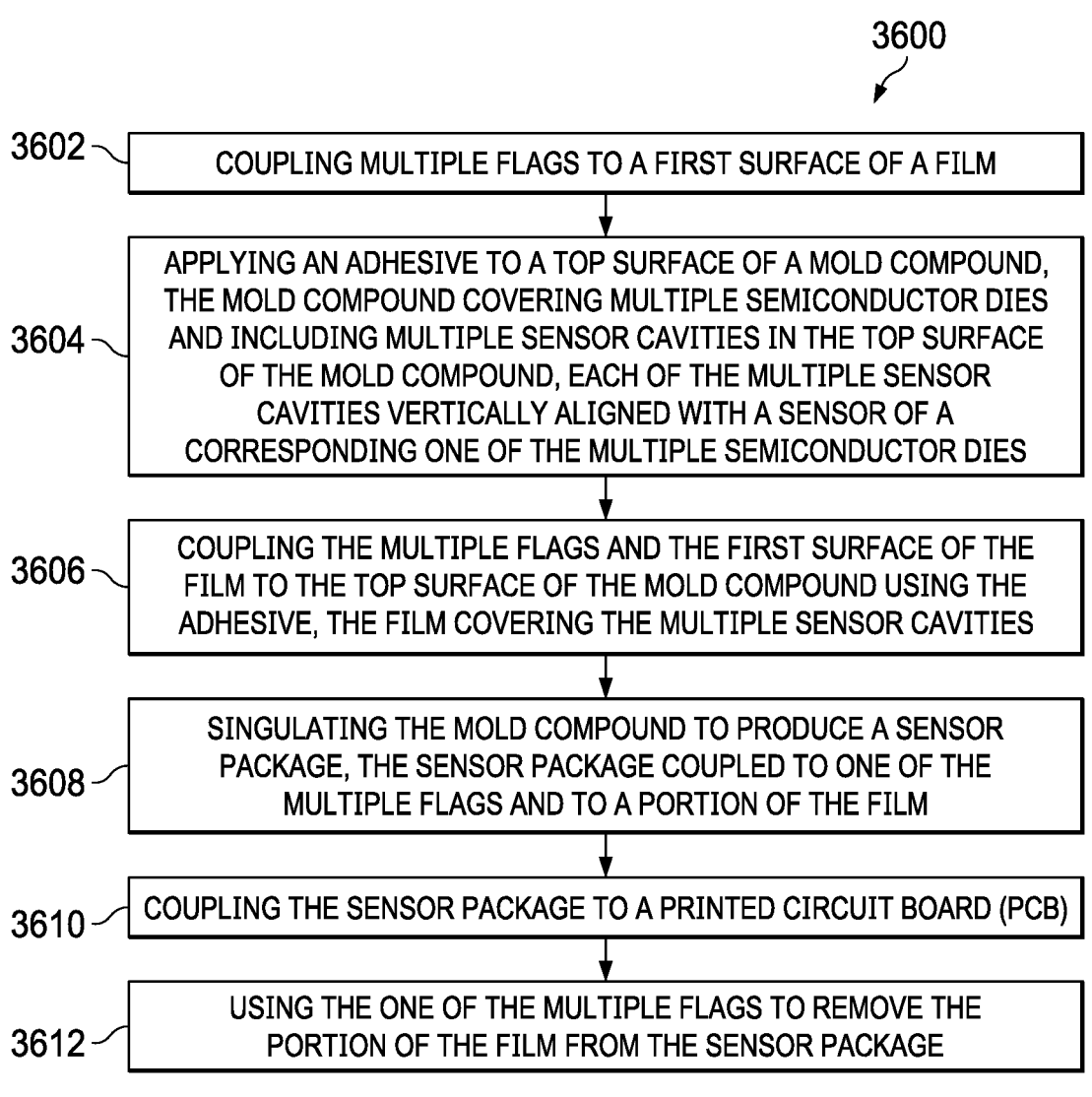

3600

3602 — COUPLING MULTIPLE FLAGS TO A FIRST SURFACE OF A FILM

3604 — APPLYING AN ADHESIVE TO A TOP SURFACE OF A MOLD COMPOUND, THE MOLD COMPOUND COVERING MULTIPLE SEMICONDUCTOR DIES AND INCLUDING MULTIPLE SENSOR CAVITIES IN THE TOP SURFACE OF THE MOLD COMPOUND, EACH OF THE MULTIPLE SENSOR CAVITIES VERTICALLY ALIGNED WITH A SENSOR OF A CORRESPONDING ONE OF THE MULTIPLE SEMICONDUCTOR DIES

3606 — COUPLING THE MULTIPLE FLAGS AND THE FIRST SURFACE OF THE FILM TO THE TOP SURFACE OF THE MOLD COMPOUND USING THE ADHESIVE, THE FILM COVERING THE MULTIPLE SENSOR CAVITIES

3608 — SINGULATING THE MOLD COMPOUND TO PRODUCE A SENSOR PACKAGE, THE SENSOR PACKAGE COUPLED TO ONE OF THE MULTIPLE FLAGS AND TO A PORTION OF THE FILM

3610 — COUPLING THE SENSOR PACKAGE TO A PRINTED CIRCUIT BOARD (PCB)

3612 — USING THE ONE OF THE MULTIPLE FLAGS TO REMOVE THE PORTION OF THE FILM FROM THE SENSOR PACKAGE

FIG. 36

FILM COVERS FOR SENSOR PACKAGES

CROSS-REFERENCE TO RELATED APPLICATIONS

The present application is a continuation of U.S. patent application Ser. No. 18/299,293, filed Apr. 12, 2023, which is a divisional of U.S. patent application Ser. No. 17/116, 963, filed on Dec. 9, 2020, now U.S. Pat. No. 11,658,083, granted May 23, 2023, the contents of both of which are herein incorporated by reference in their entirety.

BACKGROUND

Electrical circuits are formed on semiconductor dies and subsequently packaged inside mold compounds to protect the circuits from damage due to elements external to the package, such as moisture, heat, and blunt force. To facilitate communication with electronics external to the package, an electrical circuit within the package is electrically coupled to conductive terminals. These conductive terminals are positioned inside the package but are exposed to one or more external surfaces of the package. By coupling the conductive terminals to electronics external to the package, a pathway is formed to exchange electrical signals between the electrical circuit within the package and the electronics external to the package via the conductive terminals.

SUMMARY

In some examples, a sensor package includes a semiconductor die having a sensor; a mold compound covering a portion of the semiconductor die; and a cavity formed in a top surface of the mold compound, the sensor being in the cavity. The sensor package includes an adhesive abutting the top surface of the mold compound, and a semi-permeable film abutting the adhesive and covering the cavity. The semi-permeable film is approximately flush with at least four edges of the top surface of the mold compound.

In some examples, a method comprises covering an array of semiconductor dies with a mold compound, the mold compound having an array of cavities in a top surface of the mold compound. Each cavity in the array of cavities is vertically aligned with a sensor of a corresponding semiconductor die in the array of semiconductor dies. The method comprises coupling a semi-permeable film to the top surface of the mold compound using an adhesive. The semi-permeable film covers the array of cavities, and the semi-permeable film has an array of orifices. The method includes singulating the semiconductor dies in the array of semiconductor dies from each other to produce a sensor package. The sensor package includes a portion of the adhesive, a portion of the semi-permeable film, and an orifice of the array of orifices. The orifice exposes the portion of the adhesive to an exterior of the sensor package.

BRIEF DESCRIPTION OF THE DRAWINGS

For a detailed description of various examples, reference will now be made to the accompanying drawings in which:

FIGS. 20A-25C are perspective, profile, and top-down views of another process flow for manufacturing a sensor package in accordance with various examples.

FIGS. 33-36 are flow diagrams of methods for manufacturing sensor packages in accordance with various examples.

DETAILED DESCRIPTION

Figure 1A:
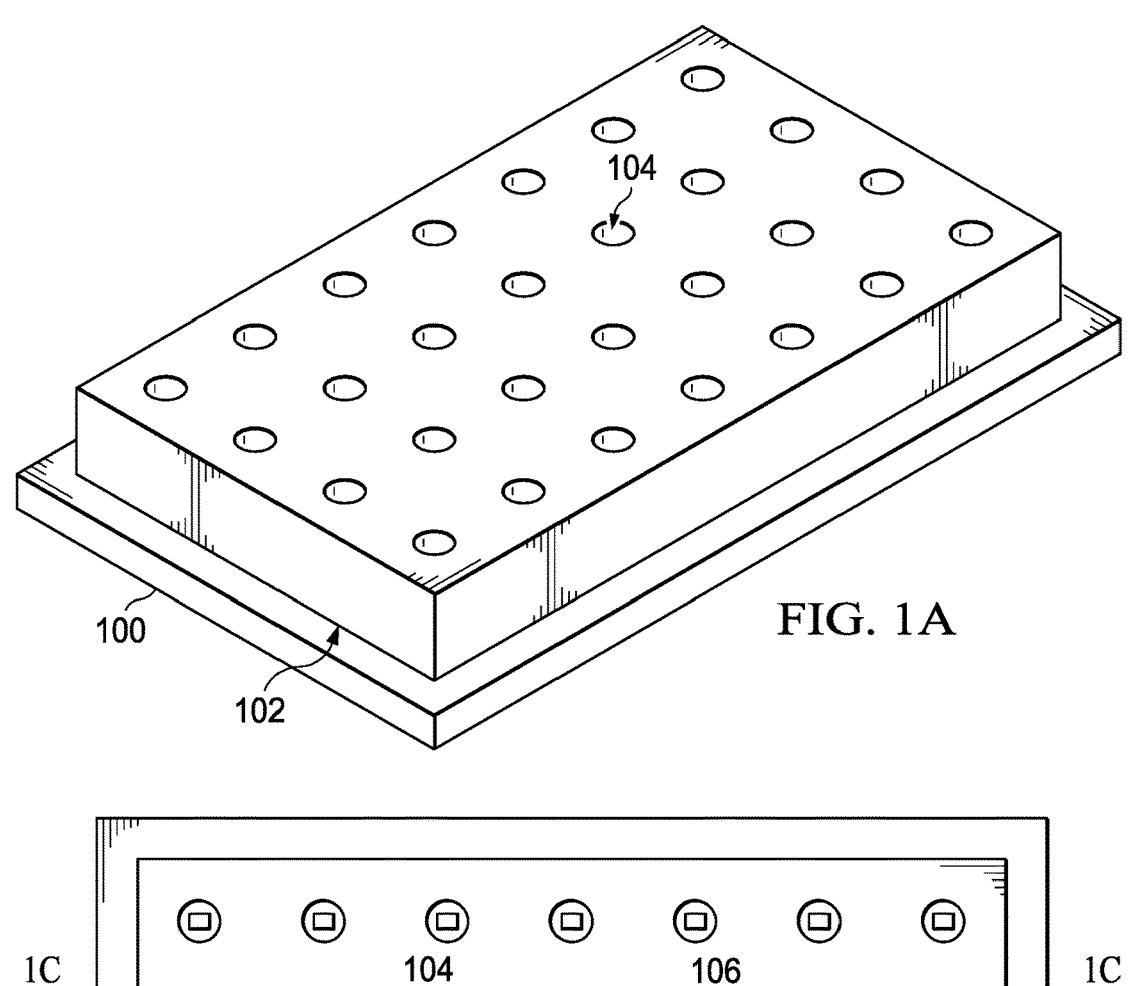
FIGS. 1A-7D are perspective, profile, and top-down views of a process flow for manufacturing a sensor package in accordance with various examples.

Some types of packages are configured to measure various physical properties of an environment, such as temperature, humidity, light, sound, pressure, etc. In many instances, the package includes a sensor that is exposed directly to the environment to be tested. Thus, for example, a package that is configured to measure the temperature of a swimming pool may be positioned in an area of the pool where the sensor will be directly exposed to the pool water. Such packages are referred to herein as sensor packages.

Sensor packages contain sensors, but they also contain other circuitry, such as an analog front-end (AFE) circuit, to process the properties of the environment sensed by the sensor. This circuitry cannot be exposed to the environment, as doing so could damage the circuitry and render it inoperable. Accordingly, sensor packages are fabricated so that the sensor is exposed to the environment, but the remaining circuitry of the package is covered by the mold compound of the package. A sensor package may include a cavity in its mold compound, and the sensor is positioned inside this cavity from a top view of the sensor package.

Existing designs for sensor packages are unsatisfactory for multiple reasons. One such reason relates to the manner in which sensors in sensor packages are protected from exposure to dust, debris, pollution, and corrosive substances (e.g., flux, solder, cleaning solvents). Sensors are especially vulnerable to such exposure at the time that sensor packages are coupled to printed circuit boards (PCBs), although exposure may happen at any time in the life cycle of a sensor. Such exposure can negatively affect the life and performance of the sensor. To protect sensors from such exposure, existing sensor packages may include a film that permits materials to be sensed (e.g., air for a humidity sensor, pressure sensor, or sound sensor) to pass through the film and that prevents dust, debris, pollution, and corrosive substances from touching the sensor. In some cases, these films cover the sensor permanently, and in other instances, the films are manually removed after the PCB-mounting process is complete. These films may be effective in some instances, but they are applied manually or semi-manually with some assistance from machines. As sensor packages and sensors continue to decrease in size over time, it has become increasingly difficult to manually or semi-manually apply such films accurately. Not only are such films often improperly applied, but even when they are properly applied, the manual or semi-manual technique by which they are applied is time-consuming, expensive, and limited in capacity.

This disclosure describes various examples of sensor package manufacturing techniques that overcome the challenges described above. In some examples, the techniques include covering a lead frame strip having multiple semiconductor dies using a mold compound. The techniques further include coupling one or more films to a top surface of the mold compound. The techniques still further include singulating the mold compound to produce a sensor package. The sensor package couples to a portion(s) of the one or more films. The one or more films protect the sensor and the top surface of the mold compound of the sensor package, e.g., from dust, debris, pollution, and/or corrosive substances. The one or more films may be permanent or may be removable. For example, in some applications, the film(s) may remain on the sensor package for the life of the sensor package, continuing to protect the sensor and the top surface of the sensor package while the sensor package remains in use. In other applications, the film(s) may be removed after a dust, debris, pollution, and/or corrosive substance exposure risk has passed, for example, after the sensor package has been coupled to a PCB.

By applying the film(s) to the mold compound pre-singulation and then singulating the mold compound to produce individual sensor packages, several advantages are gained. First, the process is more accurate than manual application of films, as relatively large film(s) are applied to relatively large mold compounds, thus reducing or eliminating the small-scale precision work that introduces risk of inaccurate film placement. Second, large groups of sensor packages can be processed relatively quickly, efficiently, and at reduced cost, with minimal human intervention. Third, because the disclosed manufacturing techniques are performed on a large scale, any adhesives that are used (e.g., to attach films to mold compounds) are prevented from excessive drying, thus improving adhesive performance. Examples of such sensor package manufacturing techniques are now described with reference to the drawings.

FIGS. 1A-7 are perspective, profile, and top-down views of a process flow for manufacturing a sensor package in accordance with various examples. FIG. 33 is a flow diagram of a method 3300 for manufacturing the sensor packages of FIGS. 1A-7 in accordance with various examples. Accordingly, FIGS. 1A-7 and 33 are now described in tandem.

The method 3300 includes covering an array of semiconductor dies with a mold compound (3302). The mold compound includes an array of sensor cavities in a top surface of the mold compound, with each sensor cavity in the array of sensor cavities vertically aligned with a sensor of a corresponding semiconductor die in the array of semiconductor dies (3302). FIG. 1A is a perspective view of a carrier 100 supporting a mold compound 102 housing multiple semiconductor dies (not visible in FIG. 1A but visible in FIG. 1C and described below), each semiconductor die having a sensor formed on an active surface of the semiconductor die. The sensors are configured to sense any of a variety of properties, such as humidity, pressure, sound, light, temperature, etc. In some examples, a semiconductor die may have a single sensor, and in other examples, a semiconductor die may have multiple sensors. The remainder of this description assumes that each semiconductor die includes a single sensor, but the techniques described herein may be adapted for applications in which multiple sensors are present on one or more semiconductor dies. The mold compound 102 includes multiple sensor cavities 104, each sensor cavity 104 containing a different sensor coupled to a different semiconductor die.

Figure 1B:
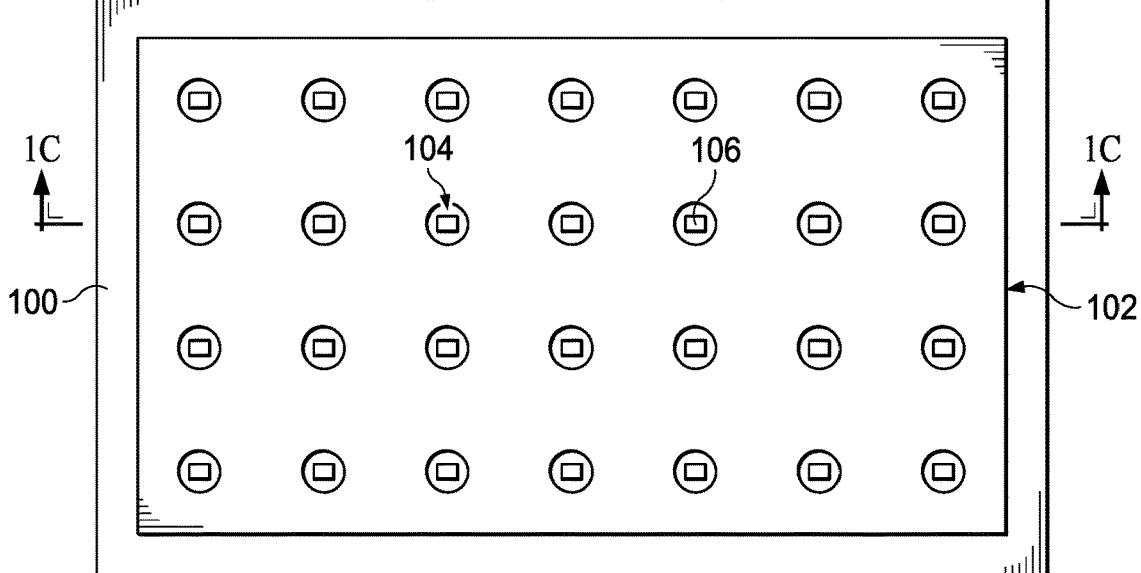
Figure 1C:
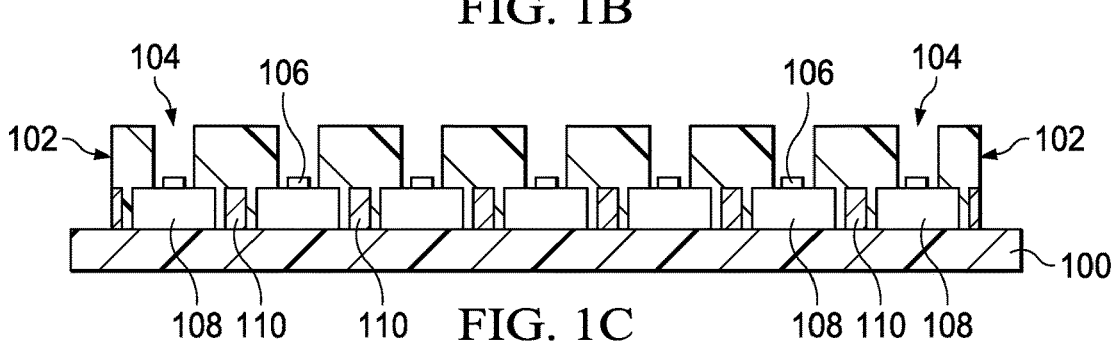

FIG. 1B is a top-down view of the structure of FIG. 1A. FIG. 1C is a profile, cross-sectional view of the structure of FIG. 1A. FIG. 1C shows multiple semiconductor dies 108, each semiconductor die 108 having a different sensor 106. Conductive terminals 110 are positioned on each side of each semiconductor die 108. The conductive terminals 110 are omitted from the remaining drawings for ease and clarity of explanation, but the conductive terminals 110 are present on each sensor package formed using the techniques described herein so as to facilitate subsequent connections with a PCB. For example, the conductive terminals 110 may be suitable for forming a quad flat no-lead (QFN) style sensor package.

Figure 2:
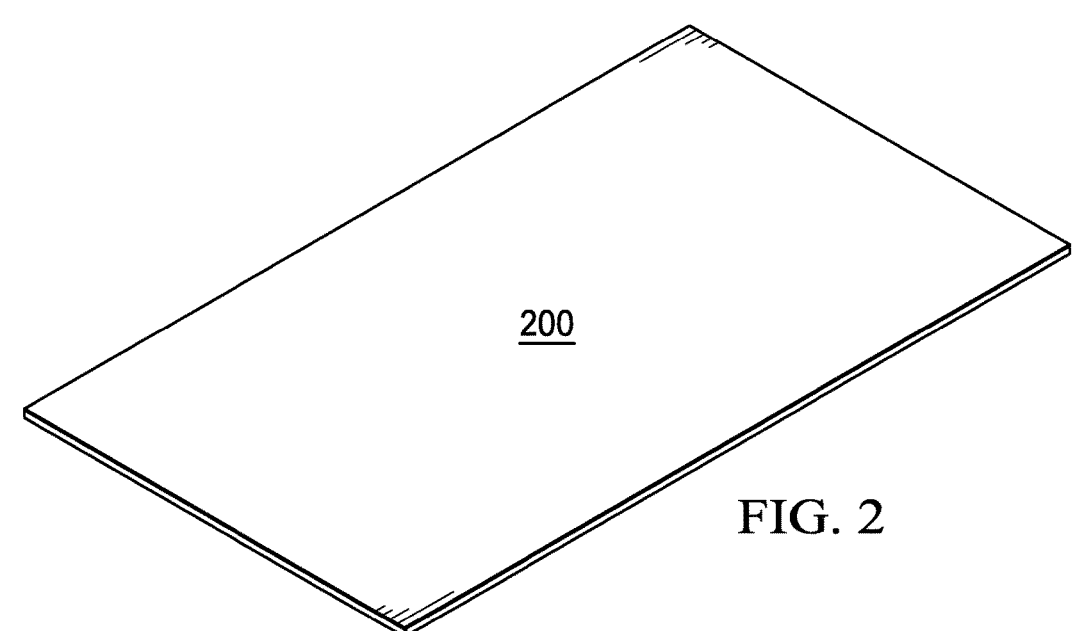
Figure 3:
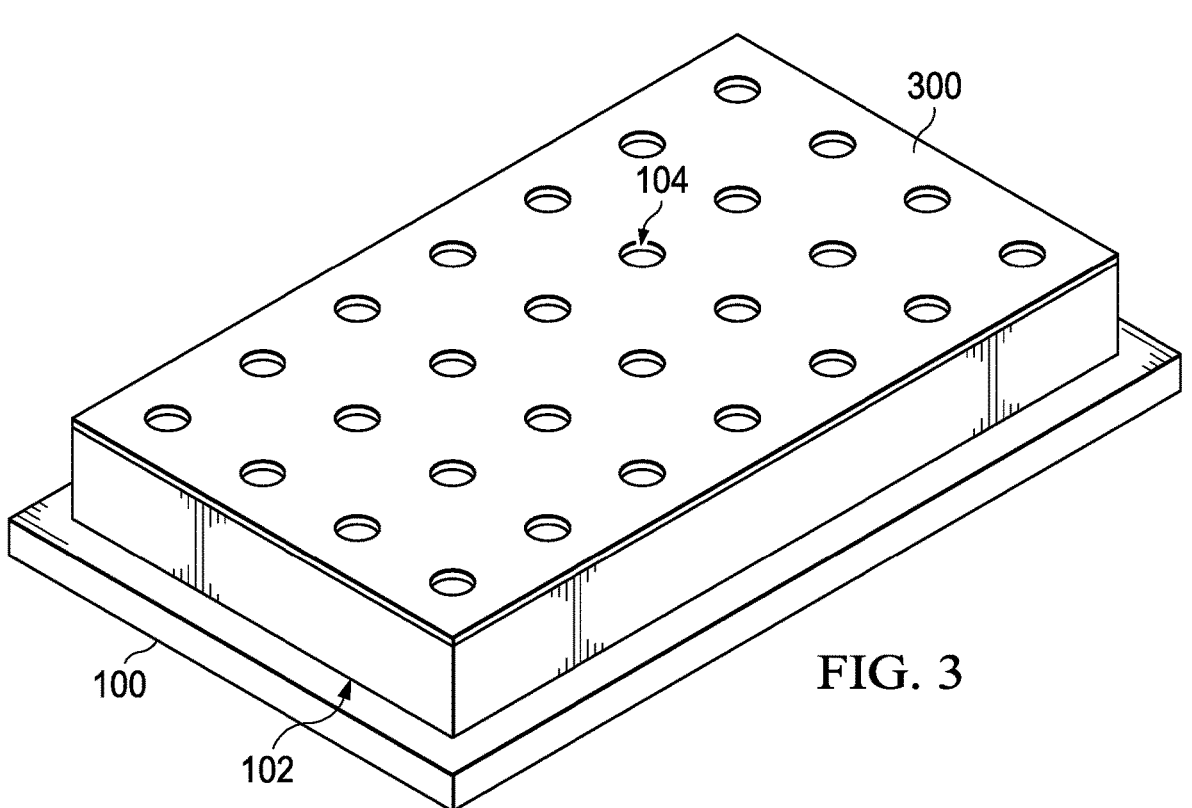

The method 3300 comprises coupling a semi-permeable film to the top surface of the mold compound using an adhesive (3304). The semi-permeable film covers the array of sensor cavities, and the semi-permeable film includes an array of orifices (3304). FIG. 2 shows a perspective view of a semi-permeable film 200. In examples, the semi-permeable film 200 comprises polytetrafluoroethylene (PTFE). In other examples, the semi-permeable film 200 comprises expanded PTFE or micro-porous PTFE formed from sintering. In examples, the permeability of the semi-permeable film 200 ranges from 100 nanometers to 10 microns, with greater permeability being advantageous because it allows faster gas exchange rates across the membrane while lesser permeability offers better liquid ingress protection under high pressure. A permeability greater than this 100 nm to 10 micron range, however, can result in excessive liquid ingress and a permeability less than this range may result in inadequately slow gas exchange. The semi-permeable film 200 may have any suitable dimensions, including length, width, and thickness. FIG. 3 is a perspective view of the structure of FIG. 1A, but with the addition of an adhesive 300 on a top surface of the mold compound 102. In examples, the adhesive 300 includes acrylates or adhesion-modified polymers, although stronger or weaker adhesives and different types of adhesives are contemplated. In examples, the adhesive 300 has an adhesive strength ranging from 0.88 N/mm$^2$ to 1.81 N/mm$^2$. In some examples, a stronger adhesive strength (e.g., at least 1.2 N/mm$^2$) for the adhesive 300 is used, because in such examples the semi-permeable film 200 may remain permanently coupled to the mold compound 102 using the adhesive 300 for the lives of the sensors 106. In examples, such a strong adhesive strength may also be beneficial during manufacture, as insufficient adhesive strength for the adhesive 300 may result in slippage or movement of the semi-permeable film 200 during, e.g., singulation. This may be particularly problematic if the semi-permeable film 200 is patterned, as in examples described below.

Figure 4A:
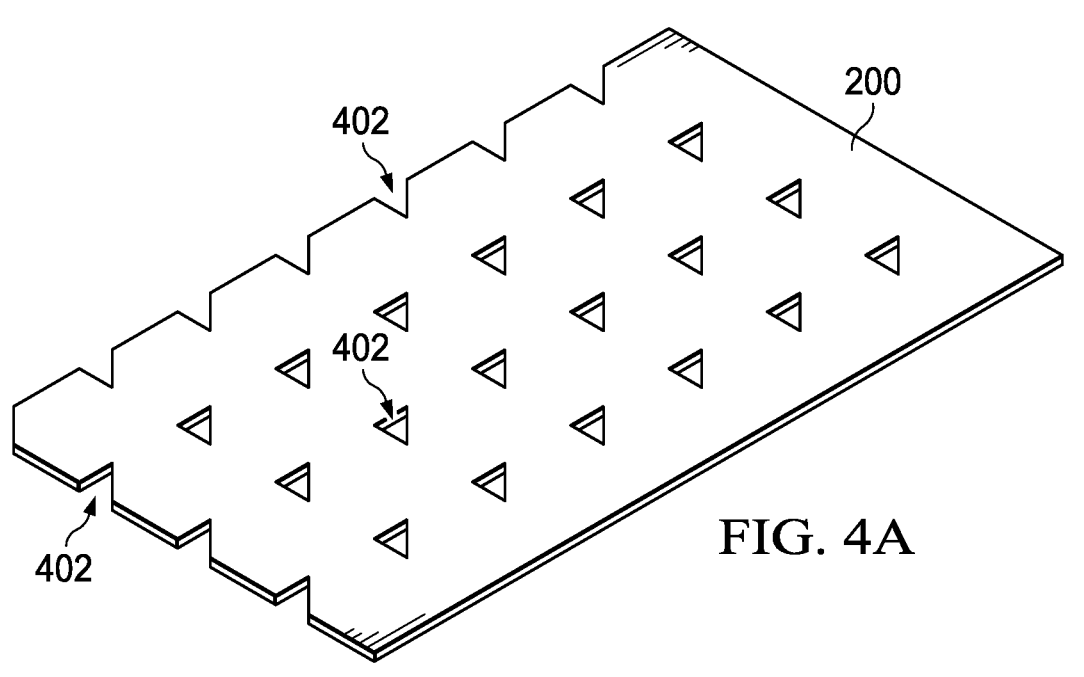
Figure 4B:
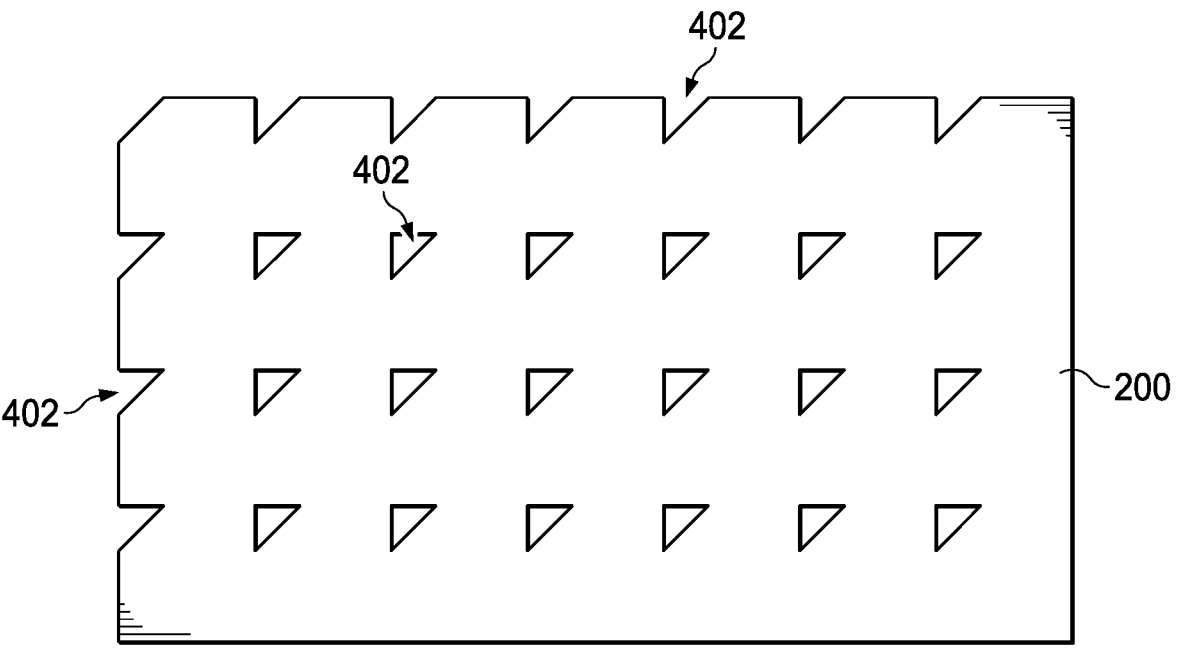

FIG. 4A is a perspective view of a patterned version of the semi-permeable film 200. Specifically, the semi-permeable film 200 may include optional orifices 402. In examples, when the semi-permeable film 200 is coupled to the top surface of the mold compound 102 using the adhesive 300 and the mold compound 102 has been singulated into individual sensor packages, each orifice 402 is positioned closest to pin 1 of the corresponding sensor package relative to the other pins of that sensor package. In this way, the orifice 402 of a sensor package identifies pin 1 of the sensor package. In examples, the orifices 402 are triangular. In examples, the orifices 402 are circular. In some examples, after the semi-permeable film 200 is coupled to the top surface of the mold compound 102 and the mold compound 102 is singulated, each orifice 402 occupies a corner of the top surface of the corresponding sensor package (e.g., after singulation, the orifice 402 on a sensor package is not circumscribed by the semi-permeable film 200), and in other examples, the orifices 402 do not occupy a corner of the top surface of the corresponding sensor package (e.g., after singulation, the orifice 402 on a sensor package is circumscribed by the semi-permeable film 200). In examples, orifices 402 that do not occupy a corner of the top surface of a corresponding sensor package may result in semi-permeable films 200 that are more easily and quickly aligned with the top surface of the mold compound 102 than would be the case with orifices 402 that do occupy a corner of the top surface of a corresponding sensor package, due to the precise alignment associated with corner orifices 402. In addition, in some examples, a stronger adhesive (e.g., greater than or equal to the minimum adhesive strength provided above) may be used when orifices 402 should have precision alignment, for example, when orifices 402 occupy corners of the top surfaces of corresponding sensor packages. The orifices 402 may be formed using any suitable technique, such as laser, die-cut, etc. FIG. 4B is a top-down view of the structure of FIG. 4A.

Figure 5A:
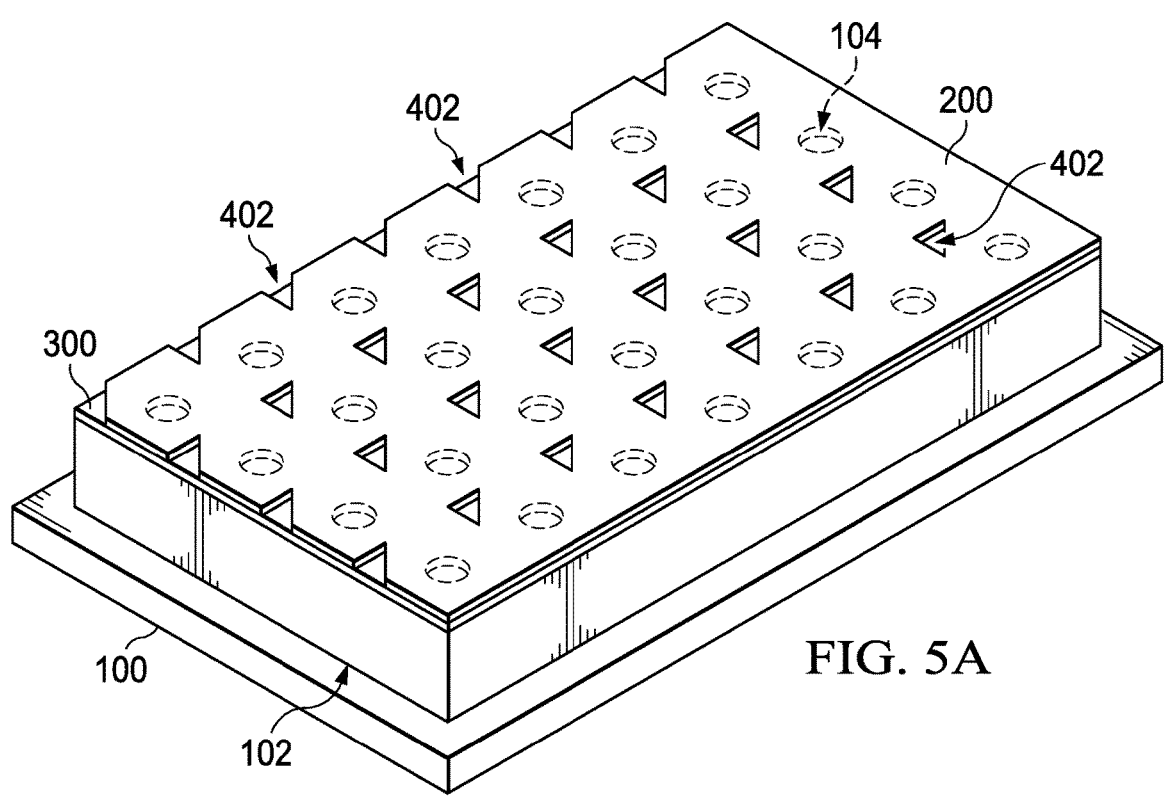
Figure 5B:
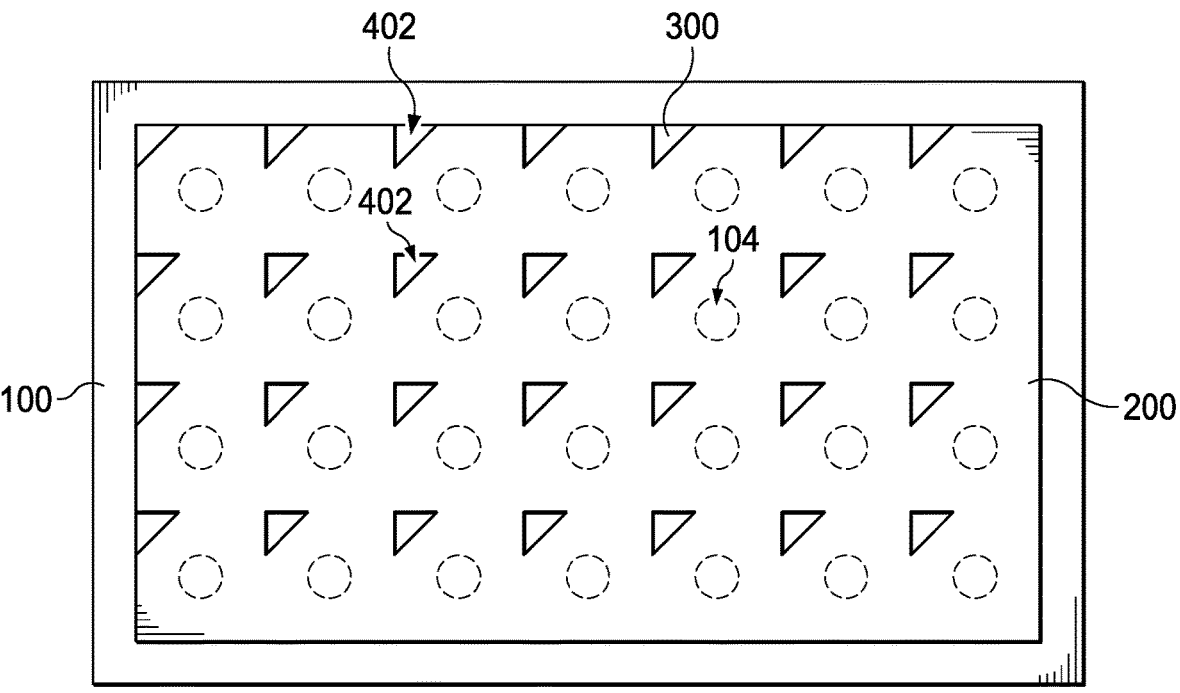

FIG. 5A is a perspective view of the semi-permeable film 200 coupled to the top surface of the mold compound 102 using the adhesive 300. As shown, the semi-permeable film 200 covers the sensor cavities 104 the sensors 106 within the sensor cavities 104, as well as portions of the top surface of the mold compound 102. In this example, the orifices 402 are aligned in a manner such that after singulation, each orifice 402 is located in a corner of a top surface of a corresponding sensor package. The adhesive 300 is exposed through the orifices 402, as shown. FIG. 5B is a top-down view of the structure of FIG. 5A.

Figure 6A:
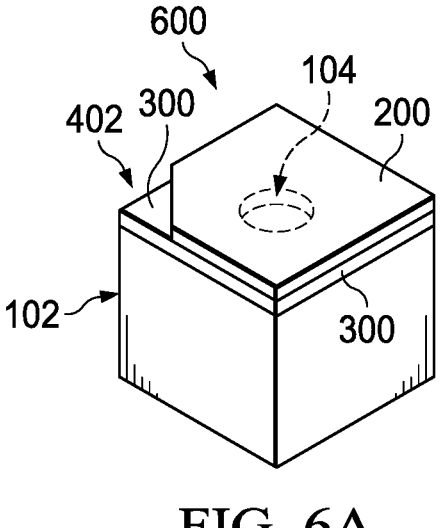
Figure 6B:
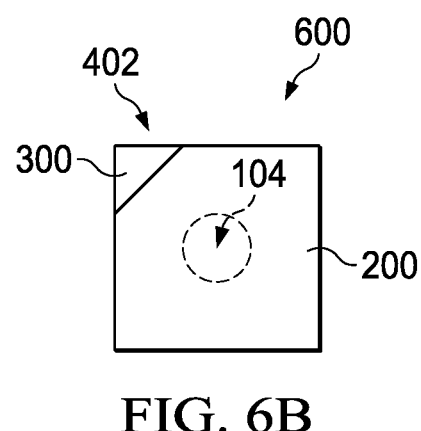

The method 3300 includes singulating the semiconductor dies in the array of semiconductor dies from each other (e.g., singulating the mold compound) to produce multiple sensor packages (3306). The sensor package includes a portion of the adhesive, a portion of the semi-permeable film, and an orifice of the array of orifices, with the orifice exposing the portion of the adhesive to an exterior of the sensor package (3306). FIG. 6A is a perspective view of an example post-singulation sensor package 600 produced using the example method 3300. FIG. 6B is a top-down view the sensor package 600. As shown in both FIGS. 6A and 6B, a portion of the semi-permeable film 200 couples to a top surface of the sensor package 600 using a portion of the adhesive 300. Further, as shown, the adhesive 300 and the semi-permeable film 200 are approximately flush (i.e., exactly flush or within 1 mm of being flush) with each edge of the top surface of the sensor package 600. In some examples, the adhesive 300 and the semi-permeable film 200 are approximately flush with at least four edges of the top surface of the sensor package 600 (e.g., the mold compound 102). In some examples, the adhesive 300 and the semi-permeable film 200 are approximately flush with at least three, at least two, or at least one edge of the top surface of the sensor package 600. The approximately flush alignment of the adhesive 300 and/or the semi-permeable film 200 with the edges of the top surface of the sensor package 600 (e.g., the mold compound 102) is evidence of use of the method 3300 to manufacture a sensor package. Manual or semi-manual techniques for applying films to individual sensor packages post-singulation will not produce such flush alignments. Coupling of the semi-permeable film 200 to the mold compound 102 and subsequent singulation, however, will produce such flush alignments, and for this reason the presence of such alignments is evidence of the use of the method 3300 described herein. Stronger adhesives 300 having the minimum adhesive strength range mentioned above may facilitate such alignments pre- and post-singulation by preventing or mitigating slippage.

Figure 7A:
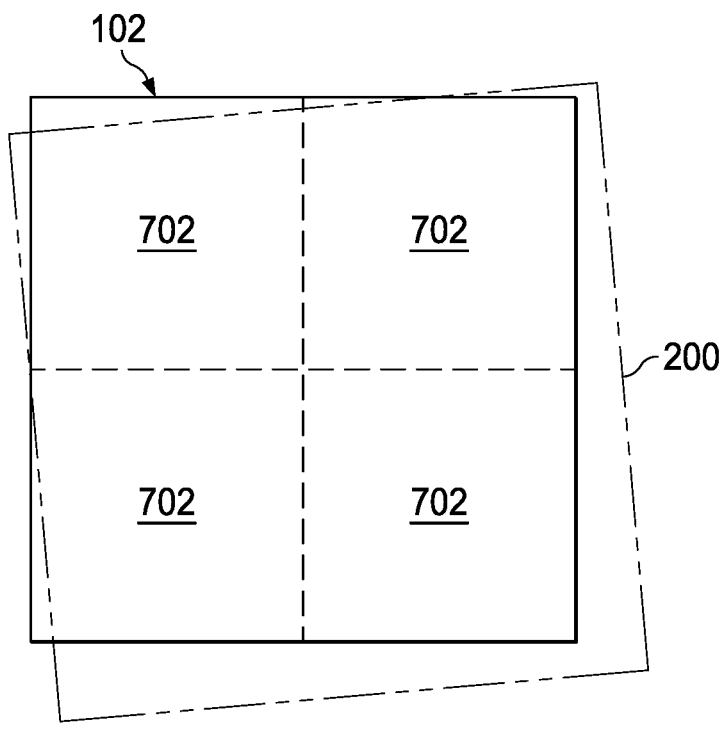

As explained above, various advantages are realized by application of the method 3300. These advantages may be most pronounced when relatively large numbers of sensor packages are manufactured in parallel, e.g., when the mold compound 102 described above covers more rather than fewer semiconductor dies. In such cases where multiple or large scales of sensor packages are simultaneously produced using the method 3300, precision coverage of the sensors 106 by the semi-permeable film 200 is achieved by the act of package singulation rather than manual or semi-manual alignment of a film on an individual sensor package. Accordingly, although these advantages of the method 3300 may be realized with any number of semiconductor dies, the advantages may be more pronounced when the semiconductor dies are arranged in such a pattern and have such a number that there are more semiconductor dies bounded on all sides by other semiconductor dies than there are semiconductor dies not bounded on all sides by other semiconductor dies. Stated another way, the advantages of the method 3300 may be more pronounced when the number of semiconductor dies along the perimeter of the group of dies is less than the number of semiconductor dies not along the perimeter of the group of dies (e.g., a square composed of 2500 dies, with 198 dies on the perimeter and 2,302 interior dies). This is because, when the semi-permeable film 200 is approximately the same size as the group of dies to be processed, proper alignment of the semi-permeable film 200 may be more difficult to achieve for the dies along the perimeter of the group of dies than for the group of dies not along the perimeter. Misalignments are more readily detectable for dies along the perimeter of the group, whereas misalignment for dies in the interior area of the group becomes irrelevant post-singulation. For groups of dies that have fewer interior dies and more dies along the perimeter of the group (e.g., a square of four dies with four perimeter dies and no interior dies), a larger semi-permeable film 200 may be used, so that precise alignment of the semi-permeable film 200 with the edges of the mold compound 102 covering the semiconductor dies is irrelevant post-singulation. FIG. 7A illustrates the case where improper alignment of the semi-permeable film 200 on a mold compound 102 covering four semiconductor dies produces poor results. In the example of FIG. 7A, only one semiconductor die 702 (on the bottom right) is fully covered by the semi-permeable film 200 and will result in a post-singulation sensor package with proper alignment of the semi-permeable film 200 with the edges of the top surface of the sensor package. FIG. 7B illustrates the case where improper alignment of the semi-permeable film 200 on a mold compound 102 covering a larger number of semiconductor dies produces good results for the interior dies post-singulation. In the example of FIG. 7B, many semiconductor dies 702 are fully covered by the semi-permeable film 200 and will result in post-singulation sensor packages with proper alignment of the semi-permeable film 200 with the edges of the top surface of the sensor packages. FIG. 7C illustrates the case where a large semi-permeable film 200 on a mold compound 102 covering a smaller number of semiconductor dies 702 produces good results for all of the dies post-singulation. In the example of FIG. 7C, all four semiconductor dies 702 are fully covered by the semi-permeable film 200 and will result in post-singulation sensor packages with proper alignment of the semi-permeable film 200 with the edges of the top surface of the sensor packages. FIG. 7D is a perspective view of the sensor package 600 coupled to a PCB 700. Conductive terminals and solder connections are omitted for clarity and ease of explanation.

FIGS. 8A-19B are perspective, profile, and top-down views of another process flow for manufacturing a sensor package in accordance with various examples. FIG. 34 is a flow diagram of a method 3400 for manufacturing the sensor packages of FIGS. 8A-19B in accordance with various examples. Accordingly, FIGS. 8A-19B and 34 are now described in tandem.

Figure 8A:
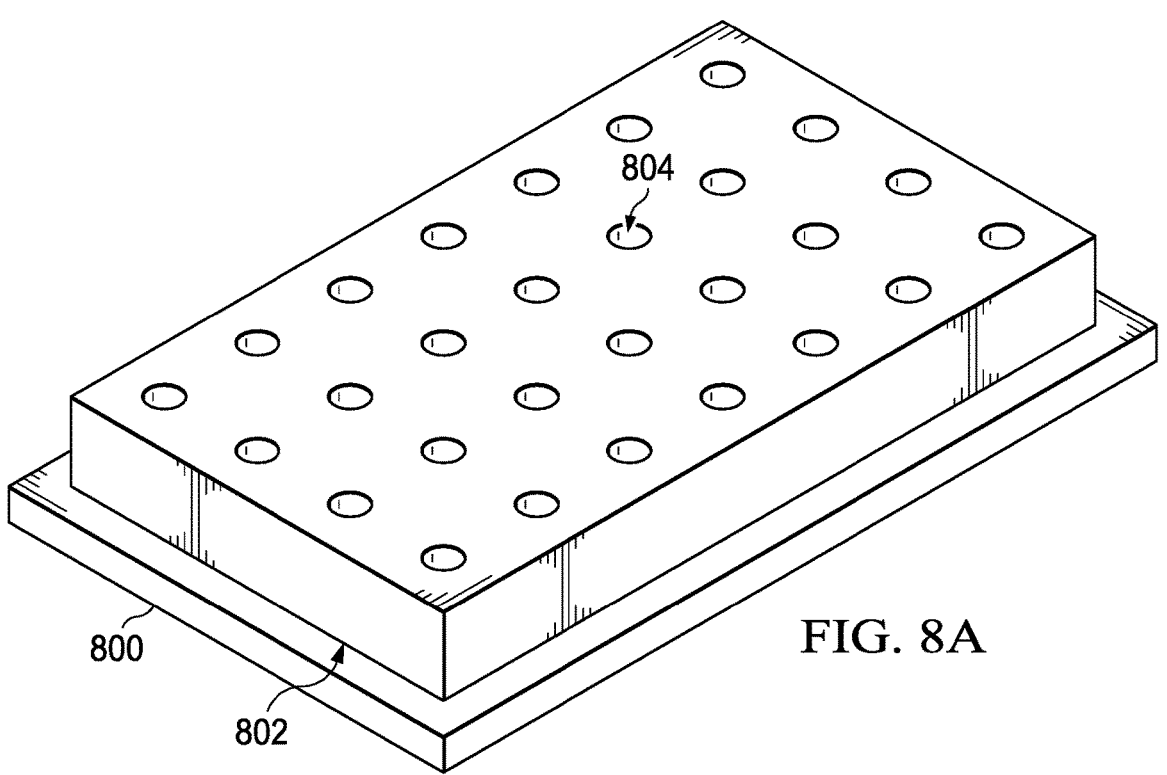
FIGS. 8A-19C are perspective, profile, and top-down views of another process flow for manufacturing a sensor package in accordance with various examples.
Figure 8B:
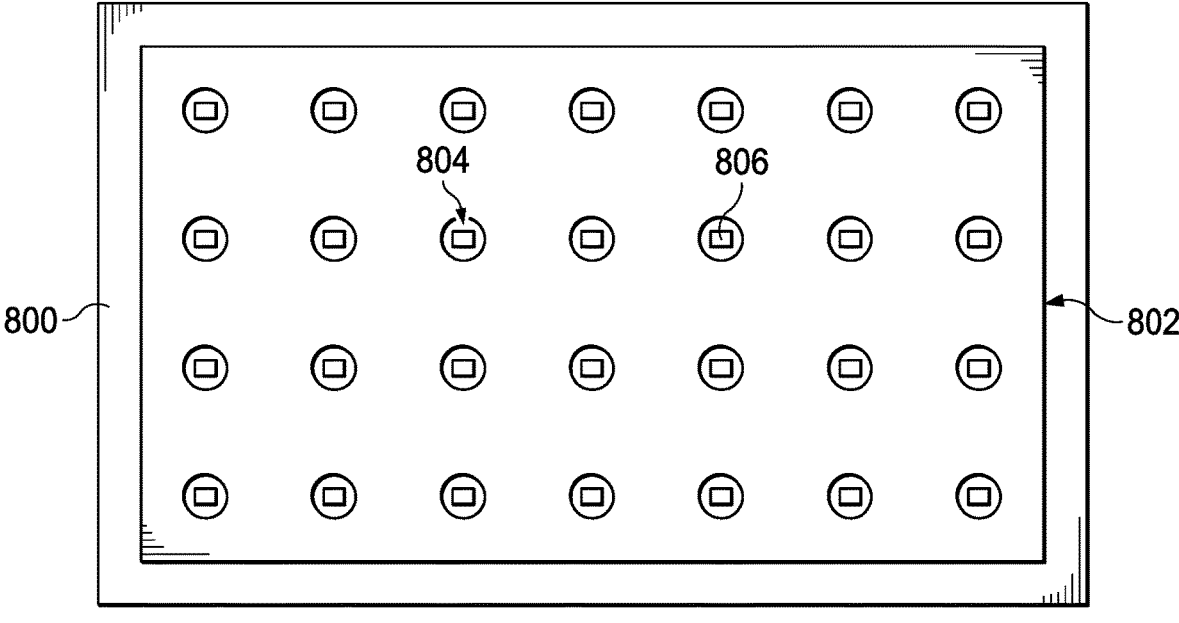

The method 3400 includes providing a first film having a first surface, the first surface having multiple rows of a first adhesive (3402). The method 3400 also includes coupling a second film to the first surface of the first film using the multiple rows of the first adhesive (3404). FIG. 8A is a perspective view of a structure that may be identical to the structure of FIG. 1A, with numerals 800, 802, and 804 corresponding to numerals 100, 102, and 104, respectively. FIG. 8B is a top-down view of the structure of FIG. 8A, with the numeral 806 corresponding to numeral 106 in FIG. 1B. Accordingly, the description provided above for FIGS. 1A and 1B also apply to FIGS. 8A and 8B.

Figure 9:
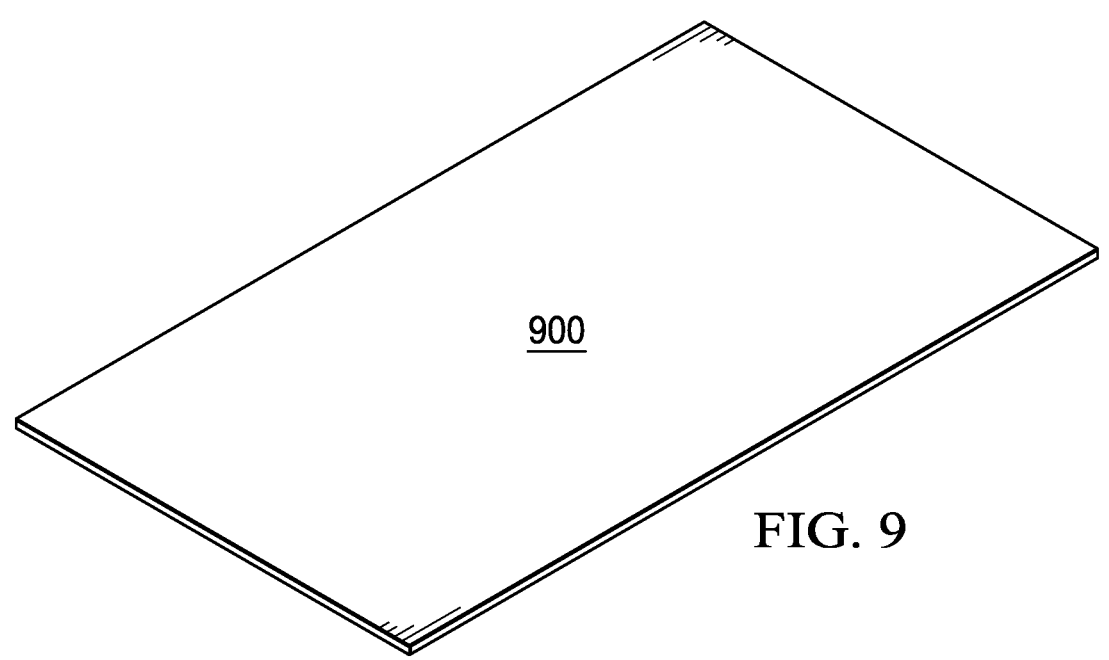
Figure 10A:
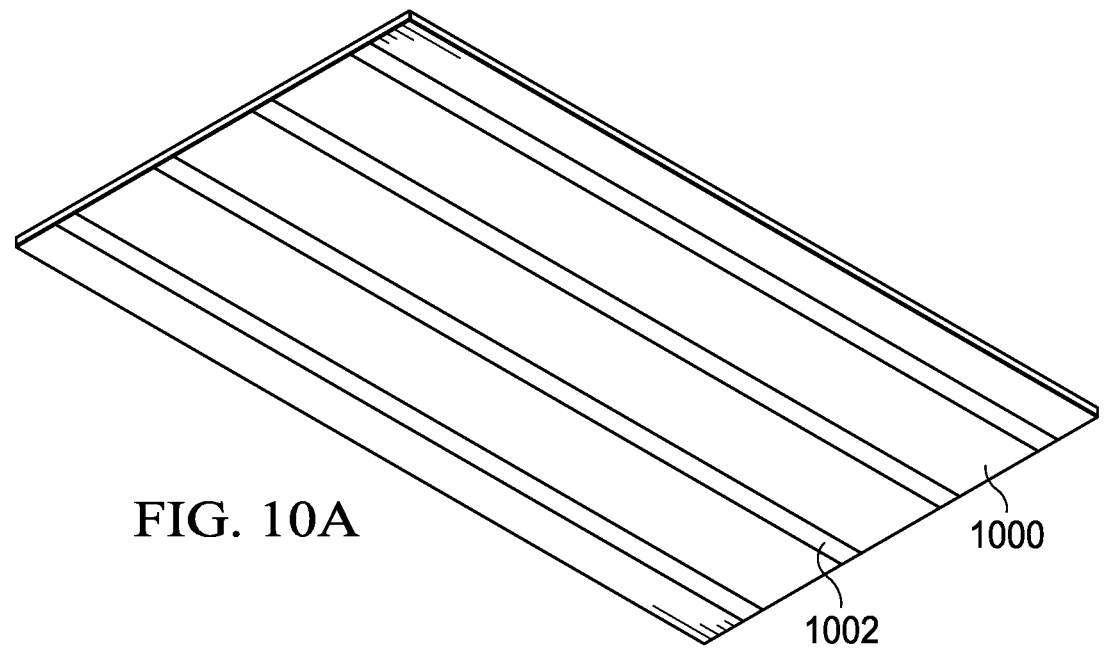
Figure 10B:
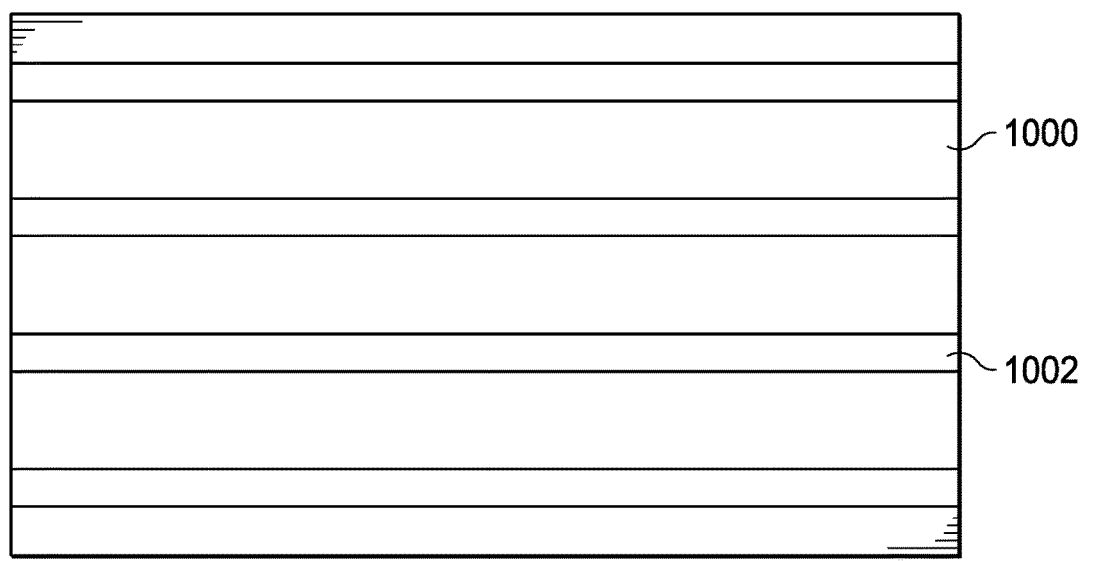
Figure 11:
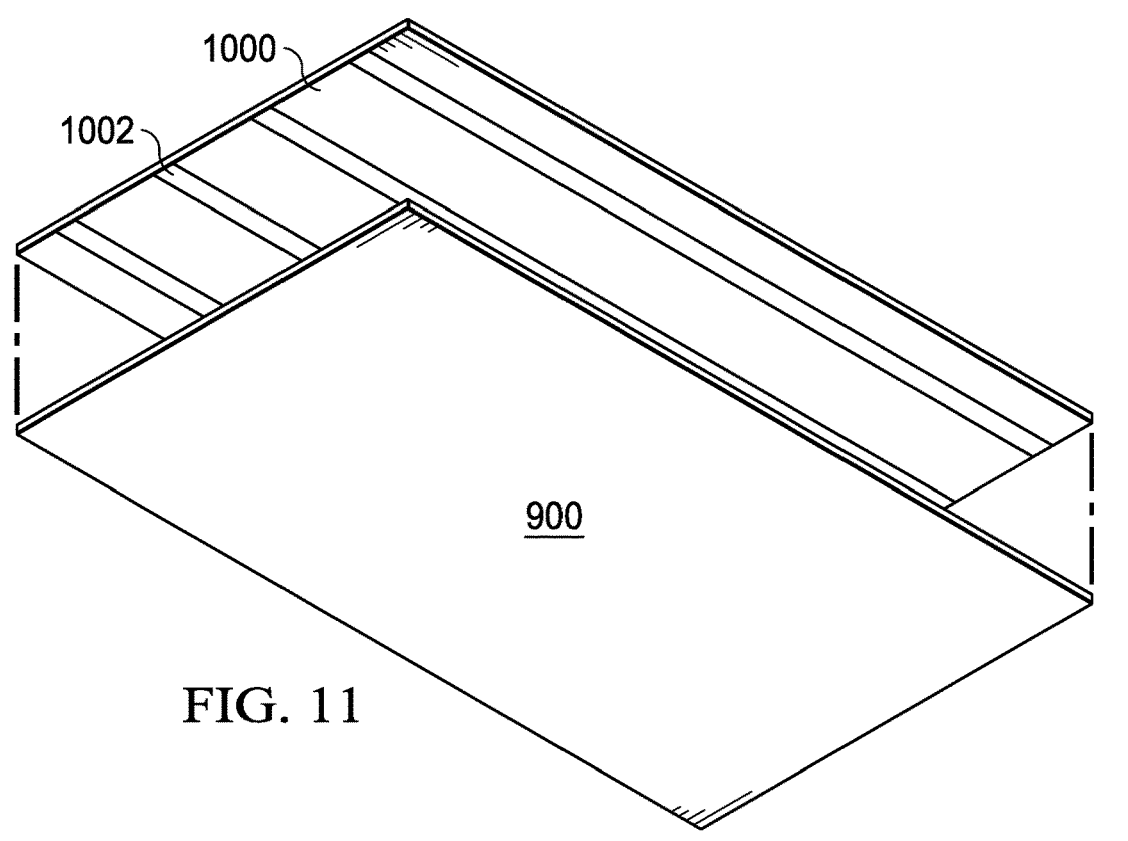
Figure 12:
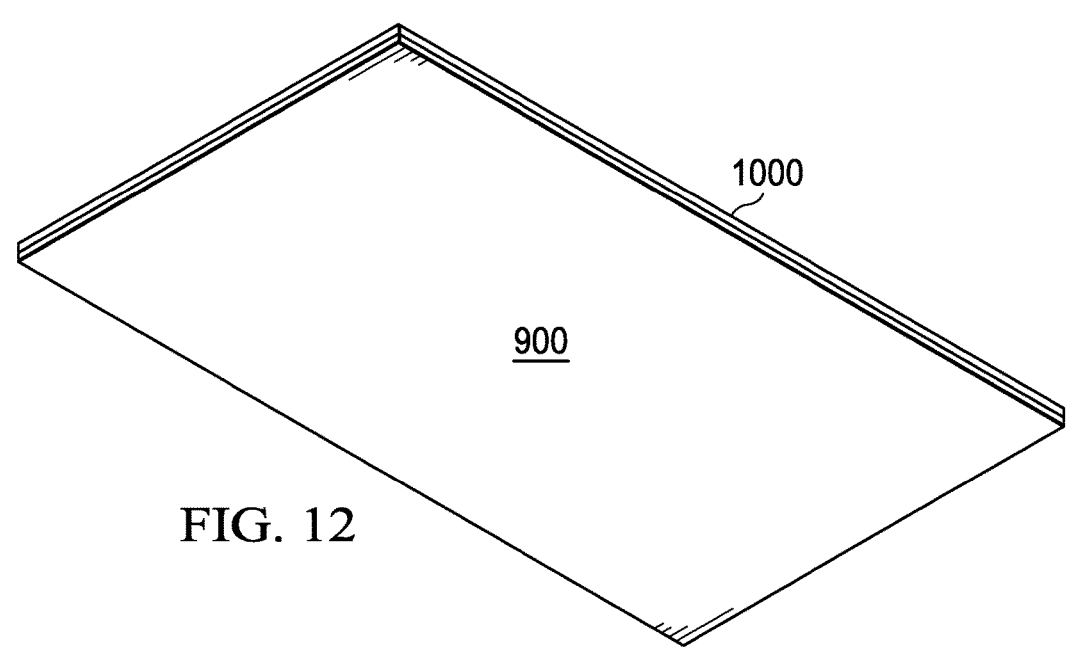

FIG. 9 is a perspective view of a non-permeable film 900. In examples, the non-permeable film 900 comprises polyimide. In other examples, the non-permeable film 900 comprises silver epoxy-based materials, anisotropic conductive films and pastes, etc. The dimensions of the non-permeable film 900, including length, width, and thickness, may vary as may be suitable. FIG. 10A is a perspective view of a film 1000. In examples, the film 1000 comprises plastic (e.g., high-density polyethylene), although other materials, such as silicone-coated kraft paper, also may be used. Adhesive 1002 is applied to the film 1000. In examples, the adhesive 1002 is applied in multiple rows along a length of the film 1000, as shown. Other arrangements are contemplated, for example, the adhesive 1002 may be applied in multiple rows along a width of the film 1000. In examples, the adhesive 1002 comprises acrylates and adhesion-modified polymers customized to the surface properties of interest. In examples, the adhesive 1002 has an adhesive strength ranging from $0.88$ N/mm$^2$ to $1.81$ N/mm$^2$, and in some examples, the adhesive 1002 has an adhesive strength of at least $1$ N/mm$^2$. These ranges are significant for reasons described below, e.g., insufficient adhesive strength may result in films such as films 900 and 1000 becoming separated. FIG. 10B is a top-down view of the structure of FIG. 10A. As shown in FIGS. 11 and 12, the films 900, 1000 are then coupled together using the adhesive 1002. In examples, alternatives may be used in lieu of an adhesive, for example, a thermal, laser, or chemical bonding technique may be used to couple the films 900, 1000 together so that the areas of the films 900, 1000 are fused together in the same areas as with the adhesive 1002 and so that the fused portions of the films 900, 1000 have the same physical dimensions as the adhesive 1002.

Figure 13A:
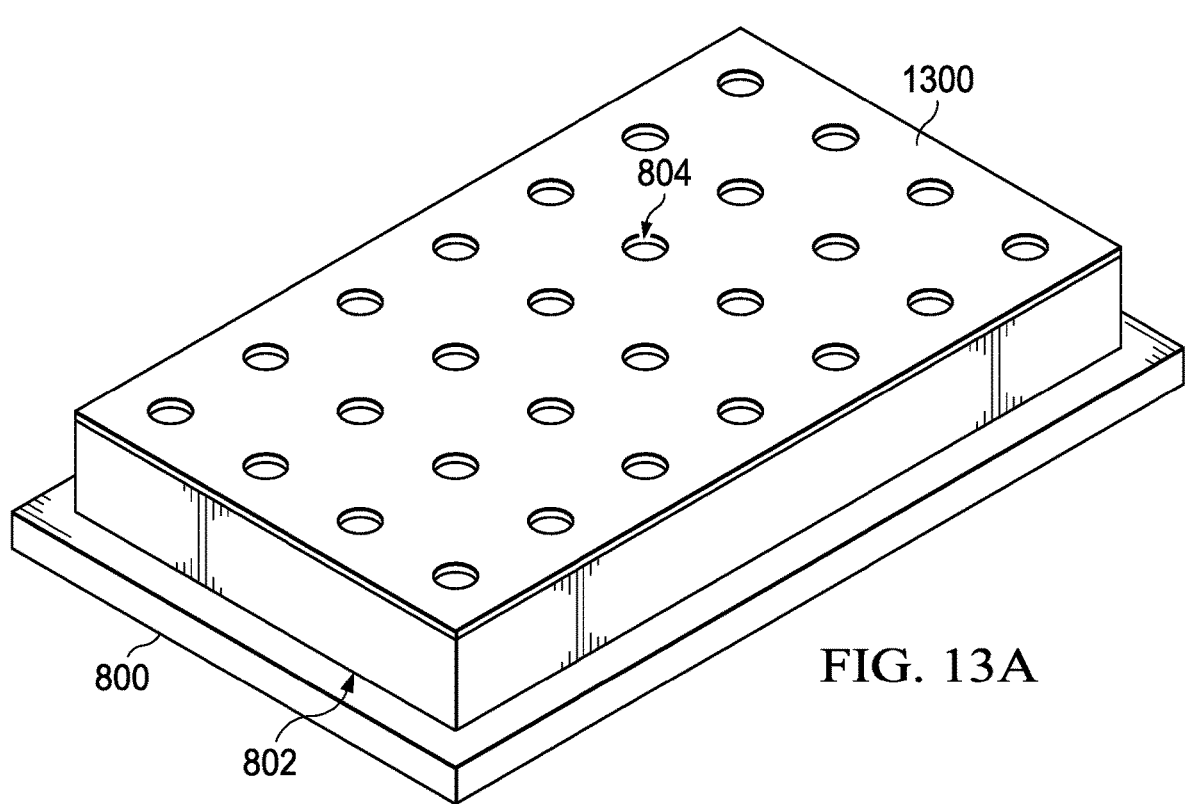
Figure 13B:
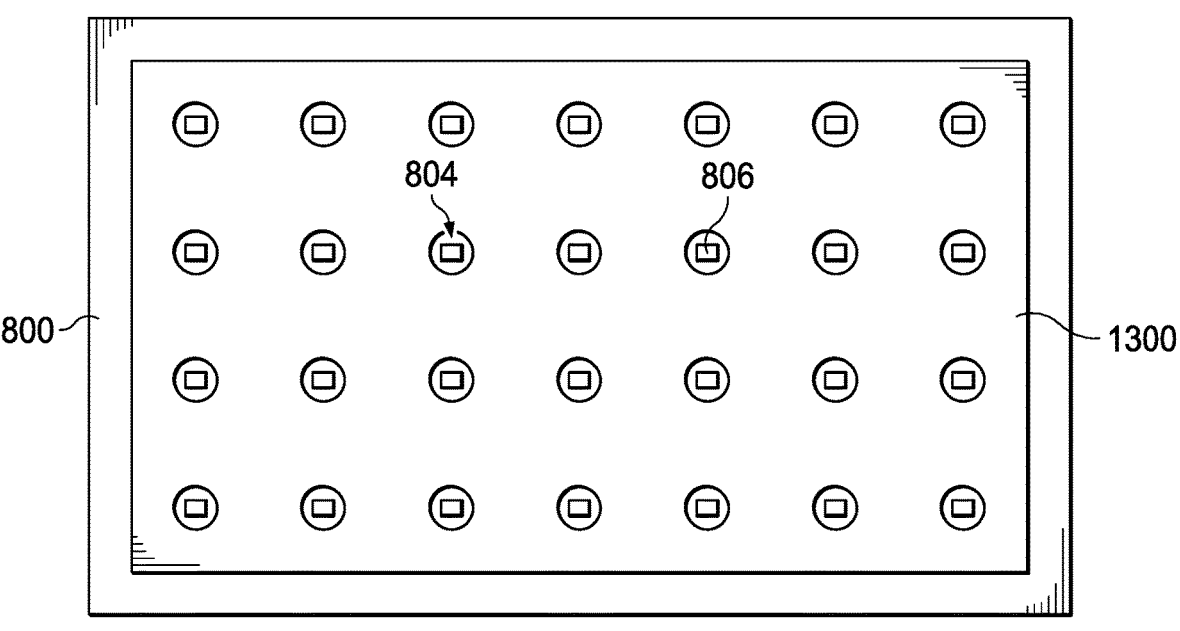

The method 3400 includes applying a second adhesive to a top surface of a mold compound (3406). The mold compound covers multiple semiconductor dies and includes multiple sensor cavities in the top surface of the mold compound, where each of the multiple sensor cavities is vertically aligned with a sensor of a corresponding one of the multiple semiconductor dies (3406). FIGS. 13A and 13B show perspective and top-down views of a structure produced by step 3406. The structure of FIGS. 13A and 13B are identical to the structure of FIGS. 8A and 8B, except with the addition of an adhesive 1300. In examples, the adhesive 1300 is the same as the adhesive 300 described above, and thus is not described again here.

Figure 14A:
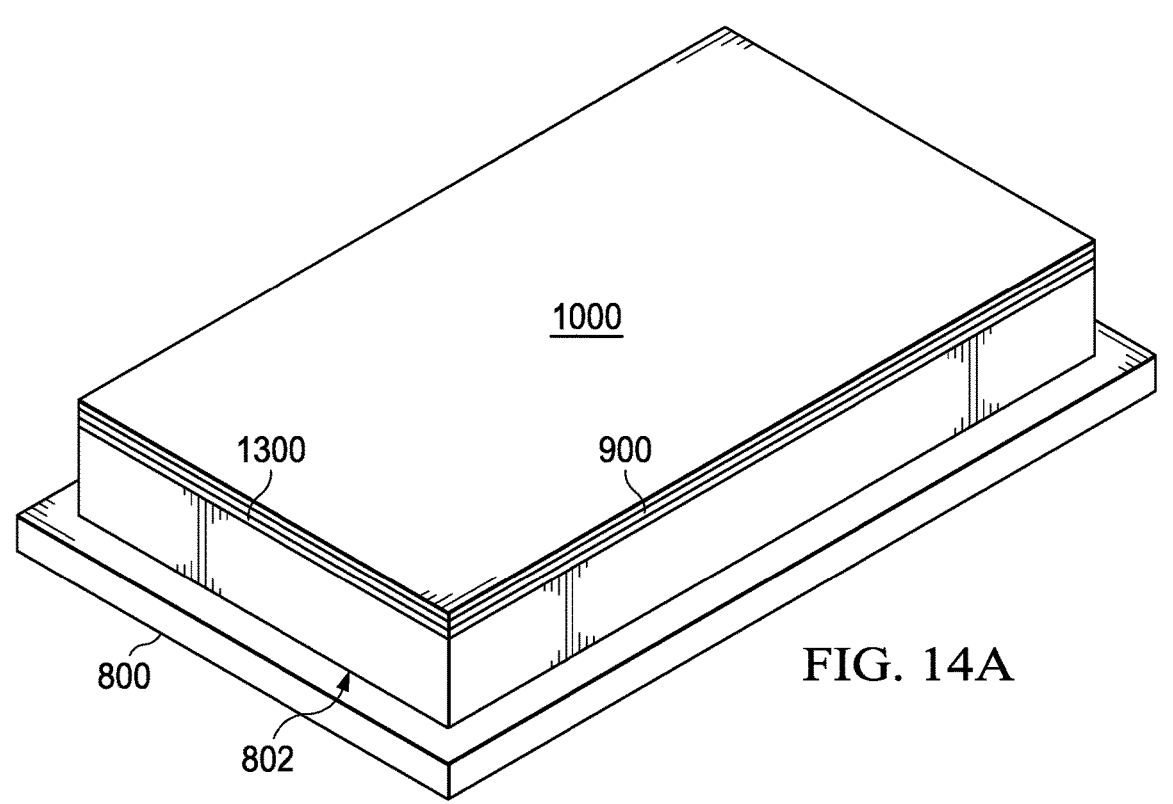

The method 3400 comprises coupling the second film to the top surface of the mold compound using the second adhesive, with the second film covering the multiple sensor cavities (3408). FIG. 14A is a perspective view of the structure of FIG. 12 coupled to the top surface of the mold compound 802 (FIG. 13A) using the adhesive 1300 (FIG.

Figure 14B:
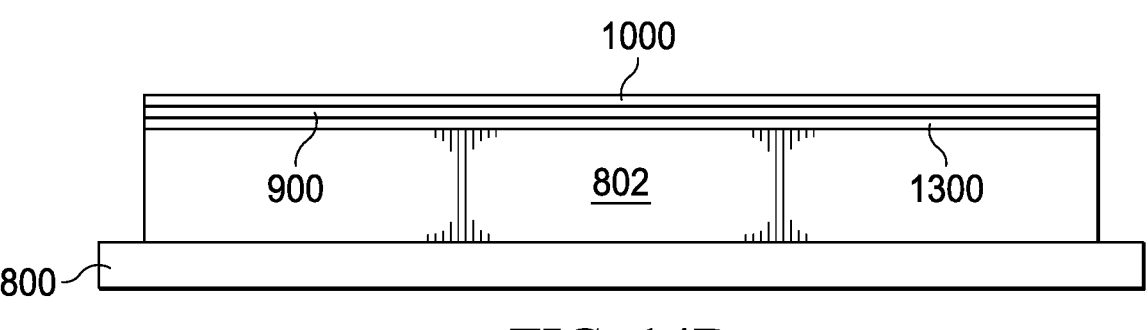
Figure 14C:
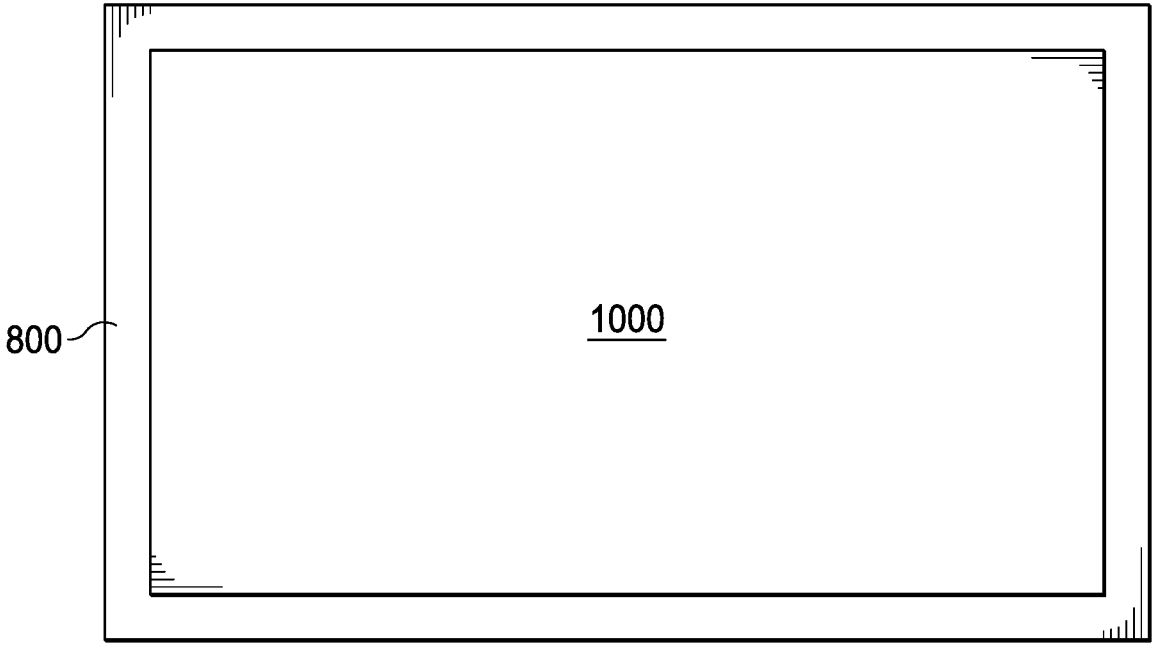

13A). As shown, the non-permeable film 900 abuts the adhesive 1300, and the film 1000 faces away from the adhesive 1300. FIGS. 14B and 14C provide profile and top-down views of the structure of FIG. 14A.

Figure 15A:
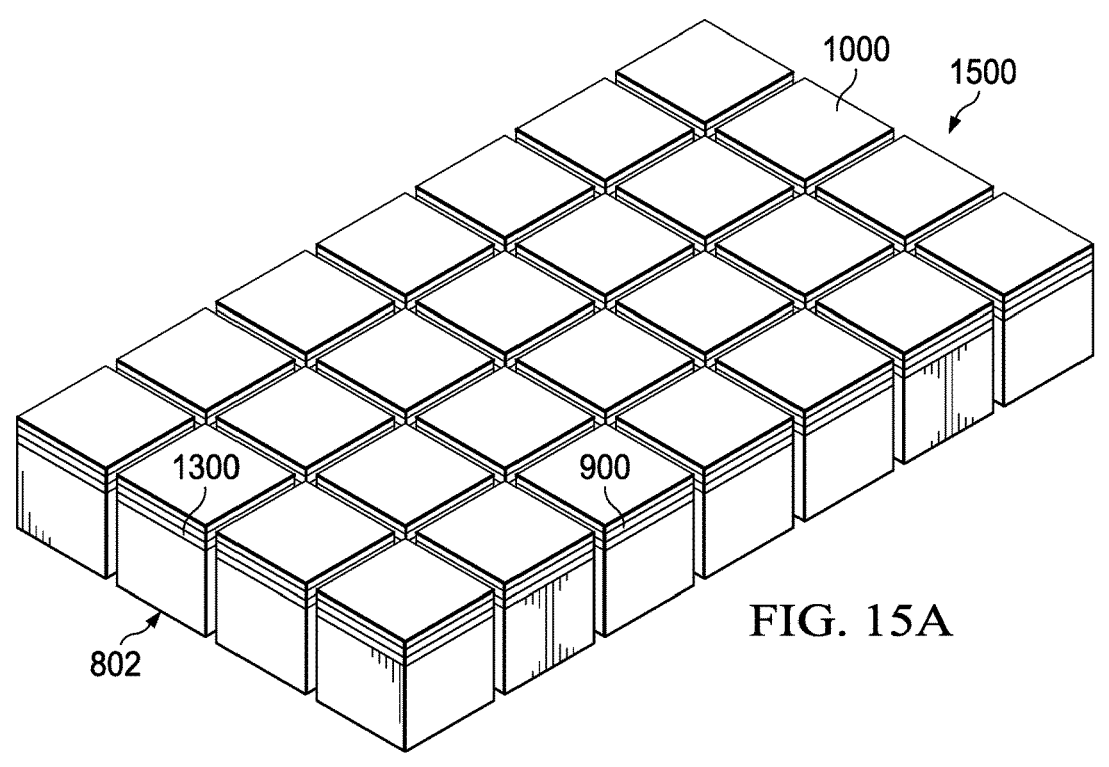
Figure 15B:
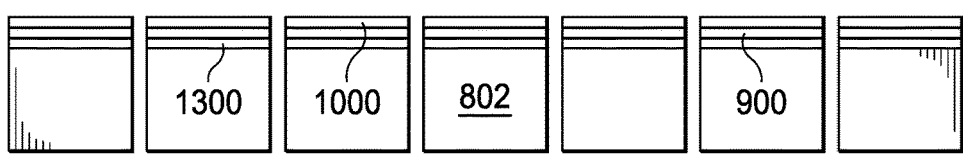
Figure 15C:
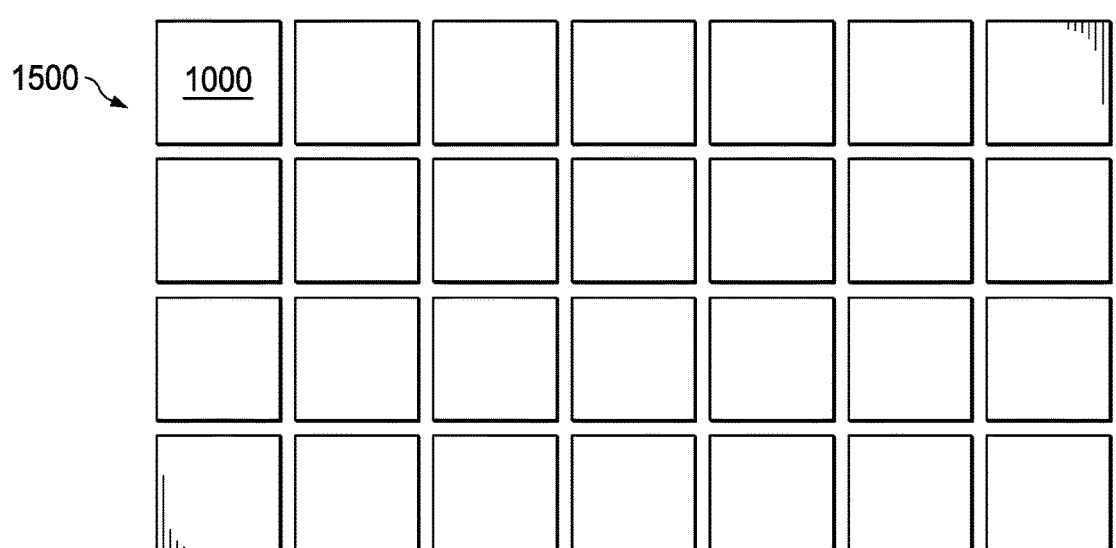

The method 3400 includes singulating the mold compound to produce a sensor package, where the sensor package is coupled to a portion of the second film and to a portion of the first film (3410). FIG. 15A is a perspective view of the structure of FIG. 14A, except that a singulation process has been performed to separate the semiconductor dies from each other and to produce multiple sensor packages 1500. The singulation may be performed using any suitable technique, including mechanical sawing, laser sawing, etc. FIG. 15B is a profile view of the structure of FIG. 15A, and FIG. 15C is a top-down view of the structure of FIG. 15A. In examples, the films 900, 1000 are approximately flush with the one, two, three, four, or more edges of the top surface of the corresponding sensor package 1500. Considerations in achieving such flush alignments of films 900, 1000 and edges of the top surface of the corresponding sensor package 1500 are similar to those provided above with respect to the method 3300 and thus are not repeated here.

Figure 16A:
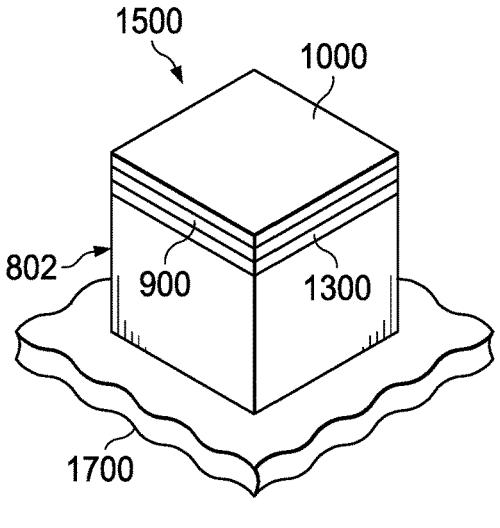
Figure 16B:
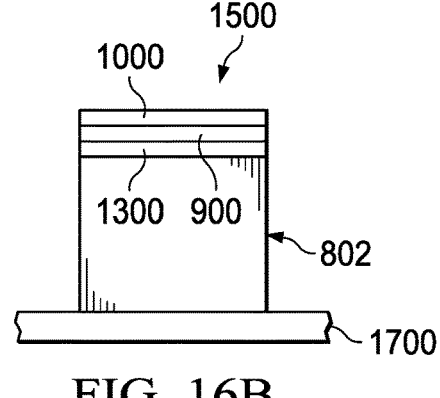
Figure 16C:
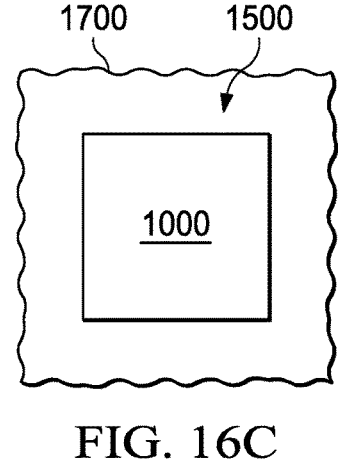

The method 3400 includes coupling the sensor package to a PCB (3412). FIGS. 16A, 16B, and 16C show perspective, profile, and top-down views of the sensor package 1500 coupled to a PCB 1700. Although the conductive terminals on the sensor package 1500, solder connections, etc. are not expressly shown for convenience and clarity, as explained above, the process of coupling a sensor package to a PCB involves dust, debris, pollution, corrosive cleaning solvents, etc. The non-permeable film 900 protects the sensor package 1500, and particularly the sensor 806 inside the sensor cavity 804, from such deleterious substances during the PCB mounting process.

Figure 17A:
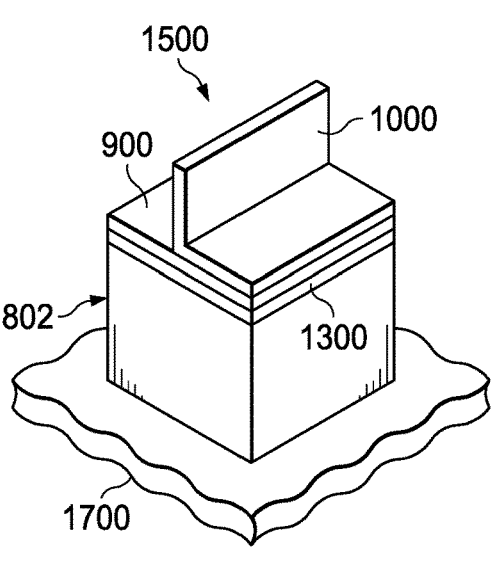
Figure 17B:
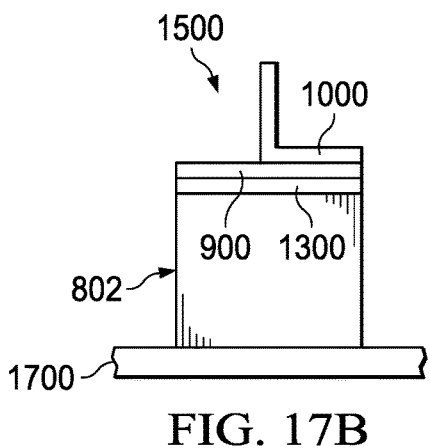
Figure 17C:
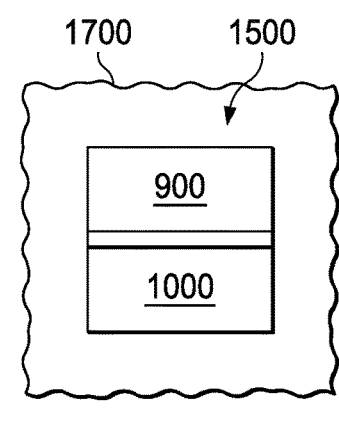
Figure 18A:
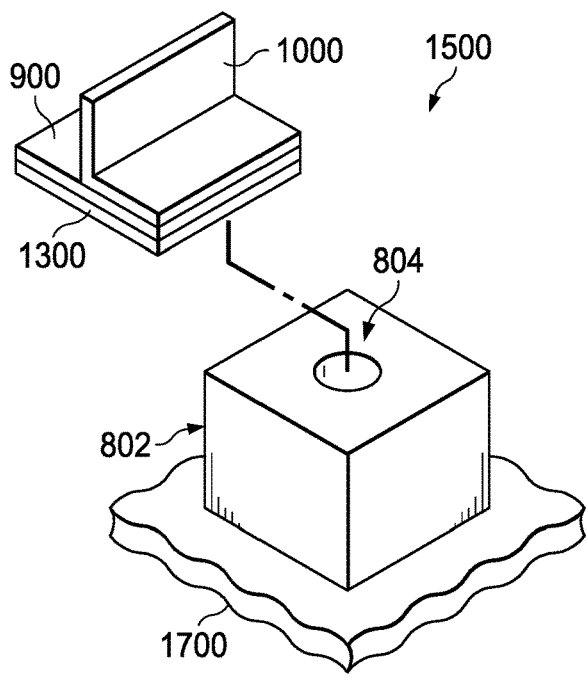
Figure 18B:
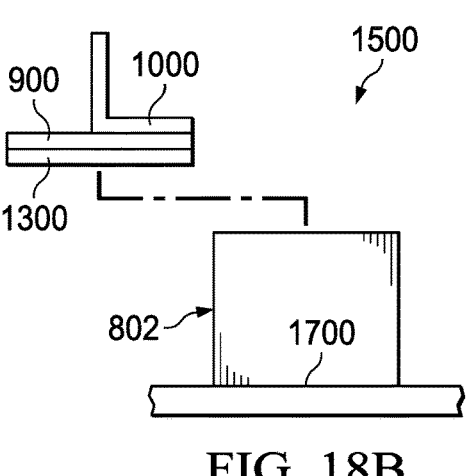
Figure 18C:
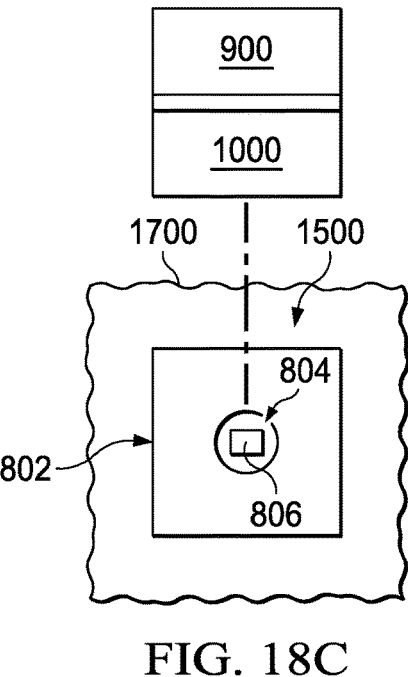
Figure 19A:
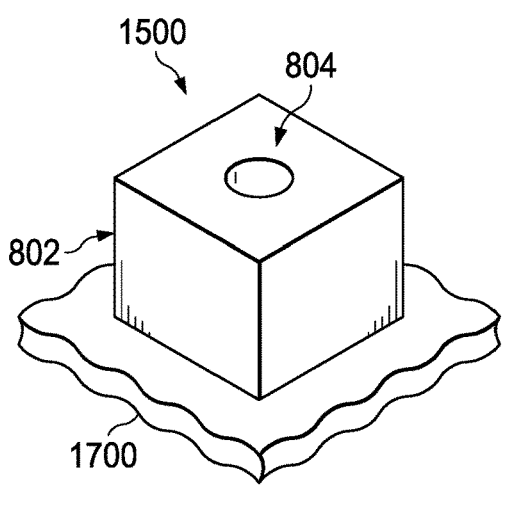
Figure 19C:
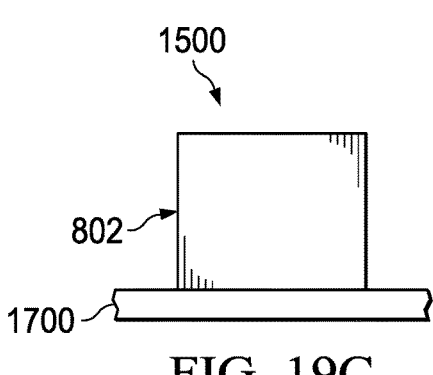
Figure 19B:
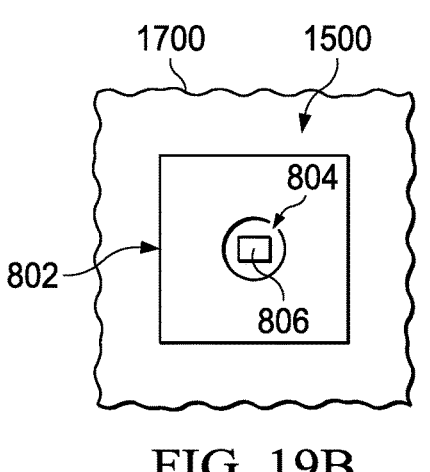

The method 3400 includes using the portion of the first film to remove the portion of the first film and the portion of the second film from the sensor package (3414). FIGS. 17A, 17B, and 17C depict perspective, profile, and top-down views of step 3414. Only some of the film 1000 is coupled to the non-permeable film 900, due to the arrangement of the adhesive 1002 in rows, as described above. The remainder of the film 1000 is not coupled to the non-permeable film 900. Accordingly, the non-coupled area of the film 1000 may function as a tab that can be lifted and grasped to peel both the film 1000 and the non-permeable film 900 off of the top surface of the sensor package 1500 (e.g., by a human or by a pick-and-place tool). Because part of the film 1000 is coupled to the non-permeable film 900 using a strong adhesive 1002 as described above, the connection between the films 900, 1000 is sufficiently strong to withstand the forces applied when the films 900, 1000 are pulled off of the sensor package 1500. In addition, the adhesive 1300 is weaker than the adhesive 1002, and thus the non-permeable film 900 is weakly coupled to the top surface of the sensor package 1500 relative to the strength of the adhesive 1002 between the films 900, 1000. FIGS. 18A, 18B, and 18C are perspective, profile, and top-down views of the films 900, 1000 being lifted off of the sensor package 1500. FIGS. 19A, 19B, and 19C are perspective, top-down, and profile views of the sensor package 1500 without the films 900, 1000. Although not expressly shown, a portion of the adhesive 1300 may remain on the top surface of the sensor package 1500 as residue.

The adhesive 1002 may have certain qualities that facilitate the performance of the method 3400, and in particular, the removal of the films 900, 1000 in step 3414. For example, if the area of coupling between the films 900, 1000 is not sufficiently large, then when the film 1000 is pulled to remove the films 900, 1000, the film 1000 may separate from the film 900, leaving the film 900 coupled to the sensor package 1500. To prevent this, in examples each row of adhesive 1002 is sufficiently wide so as to form a large coupling area between the films 900, 1000. In examples, the width of each row of adhesive 1002 may range between 5 millimeters and 30 millimeters. A row wider than this range may inappropriately increase costs and reduce the portion of the film 1000 available for gripping during removal of the films 900, 1000, and a row narrower than this range may provide inadequate adhesion between films 900, 1000.

In addition, the benefits of a sufficiently wide row of adhesive 1002 may be negated if the row is not properly aligned with a row of semiconductor dies when the film 1000 is being coupled to the mold compound 802. For example, the film 1000 or a row of adhesive 1002 on the film 1000 may be so misaligned relative to a corresponding row of semiconductor dies that, after singulation, some sensor packages 1500 will have films 900, 1000 with little or no adhesive in between them. Even slight angular misalignments may become pronounced if the film 1000 and/or mold compound 802 is sufficiently long. To mitigate such risks, in some examples the lengths of the film 1000 and/or mold compound 802 may be limited, or extra precautions may be taken to mitigate misalignments of the rows of adhesives 1002.

FIGS. 20A-25C are perspective, profile, and top-down views of another process flow for manufacturing a sensor package in accordance with various examples. FIG. 35 is a flow diagram of a method 3500 for manufacturing the sensor packages of FIGS. 20A-25C in accordance with various examples. In FIGS. 20A-25C and 35, tabs similar to those described above with reference to FIGS. 8A-19B and 34 are produced, but in a different manner. Accordingly, FIGS. 20A-25C and 35 are now described in tandem.

Figure 20A:
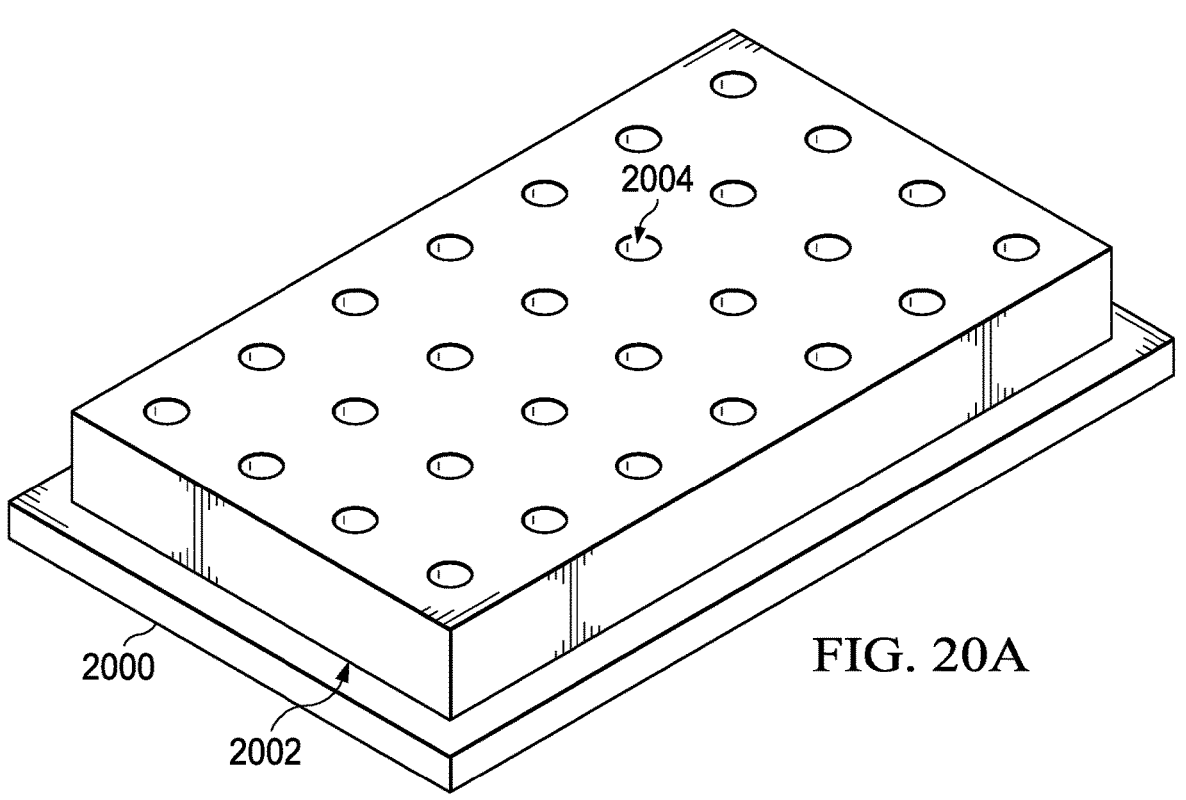
Figure 20B:
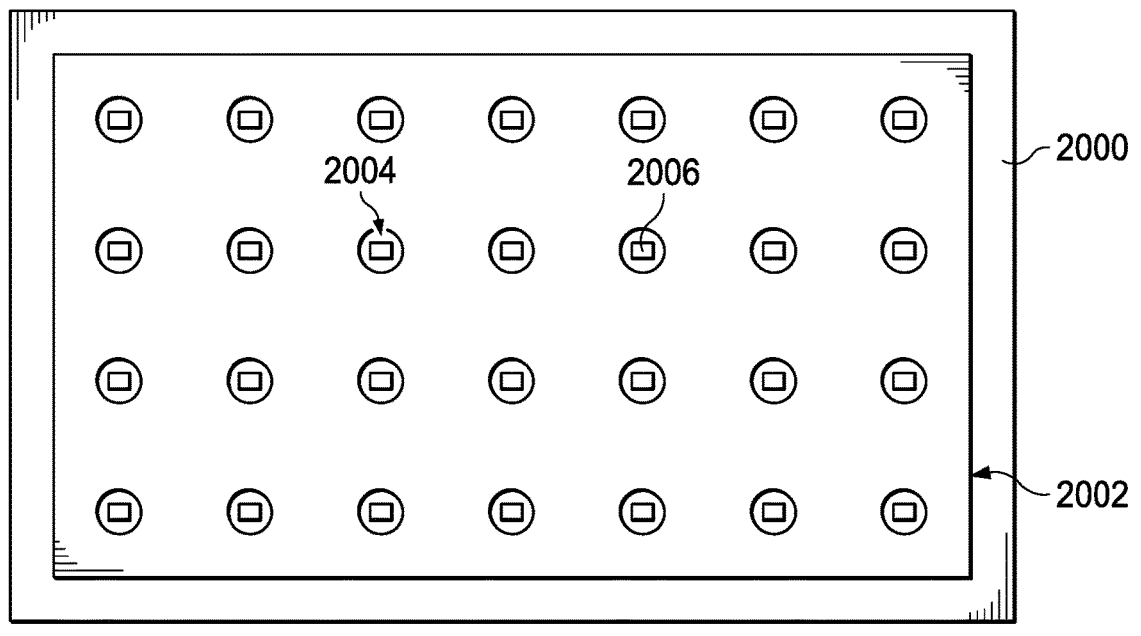
Figure 21:
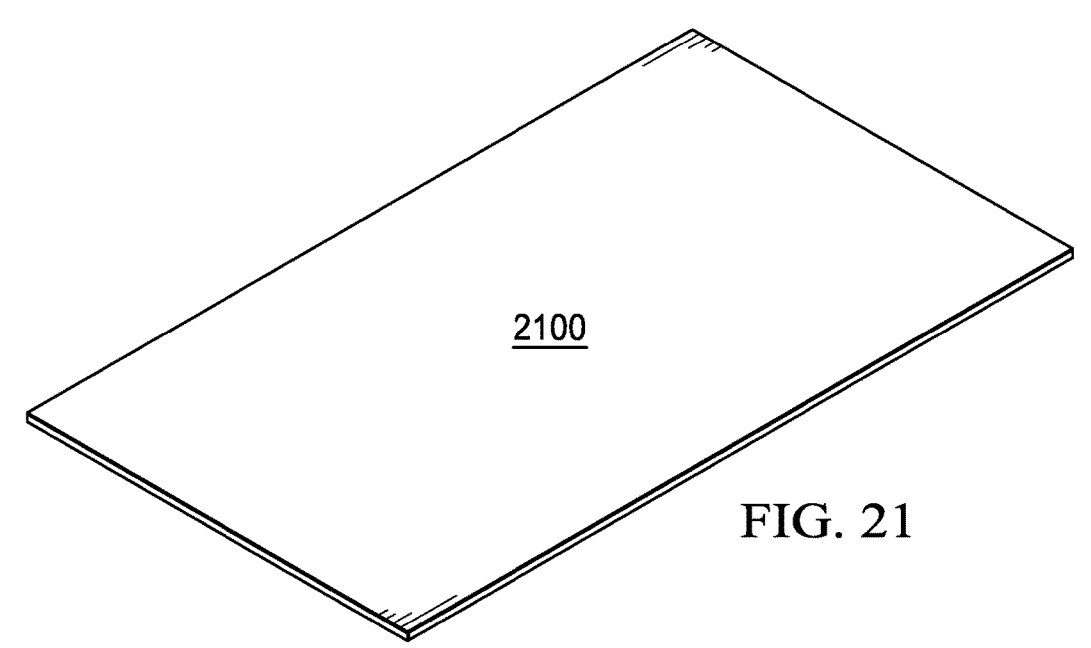
Figure 22A:
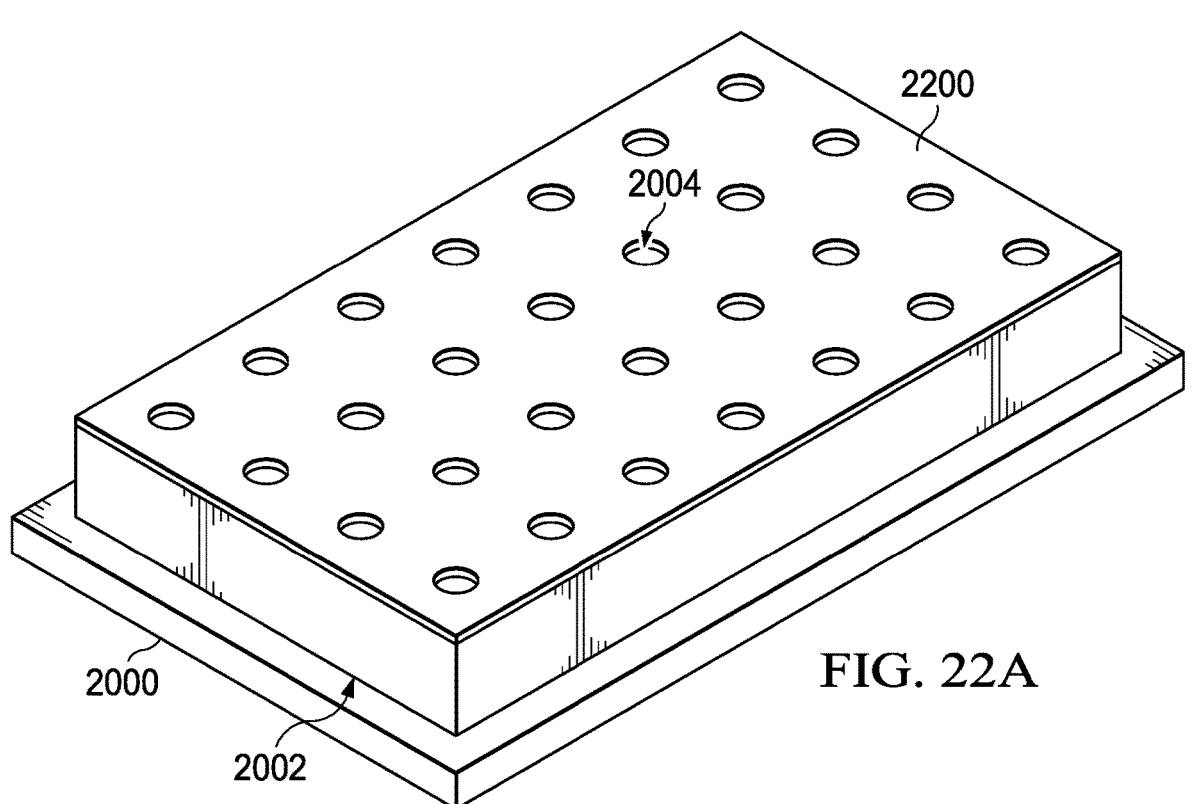
Figure 23C:
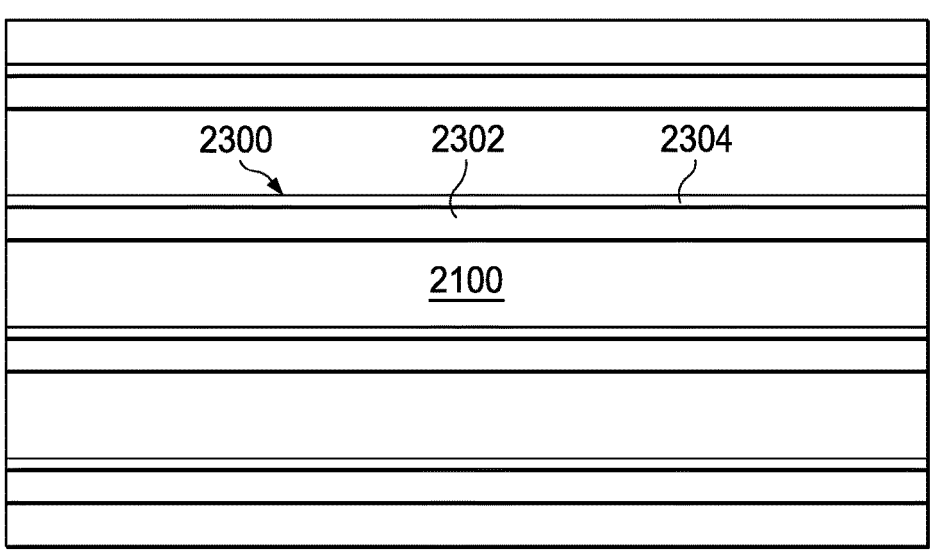

The method 3500 includes coupling a lengthwise portion of a compliant member to a first surface of a film using a first adhesive (3502). The method 3500 also includes applying a second adhesive to a top surface of a mold compound (3504). The mold compound covers multiple semiconductor dies and includes multiple sensor cavities in the top surface of the mold compound, with each of the multiple sensor cavities vertically aligned with a sensor of a corresponding one of the multiple semiconductor dies (3504). FIG. 20A is a perspective view of the structure of FIG. 1A, with numerals 2000, 2002, and 2004 corresponding to numerals 100, 102, and 104, respectively. FIG. 20B is a top-down view of the structure of FIG. 20A, with sensors 2006 visible in the sensor cavities 2004. The sensors 2006 are similar to the sensors 106 of FIG. 1B. FIG. 21 is a perspective view of a non-permeable film 2100, such as the non-permeable film 900 of FIG. 9. FIG. 22A is a perspective view of the structure of FIG. 20A, but with the addition of an adhesive 2200. The adhesive 2200 is similar to the adhesive 300 shown in FIG. 3. FIG. 22B is a top-down view of the structure of FIG. 22A. FIG. 23A is a perspective view of the non-permeable film 2100 having lengthwise portions 2302 of multiple compliant members 2300 coupled to the non-permeable film 2100 as shown. In examples, the lengthwise portions 2302 couple to the non-permeable film 2100 using a high strength adhesive, such as the adhesive 1002 described above. In examples, the description provided above for the adhesive 1002 also applies to the adhesive used to couple the lengthwise portions 2302 to the non-permeable film 2100. Because the compliant members 2300 are compliant, portions 2304 of the compliant members 2300 that are not directly coupled to the non-permeable film 2100 using adhesive may be bent or folded at an approximate right angle with reference to the lengthwise portions 2302, as shown. Such a bend or fold produces a tab that may later be grasped (e.g., by a human hand or a pick-and-place tool) to remove the compliant member 2300 and the non-permeable film 2100 from a sensor package. Alternatives to adhesives include thermal, laser, and chemical bonding techniques. FIGS. 23B and 23C are profile and top-down views, respectively, of the structure of FIG. 23A.

Figure 24:
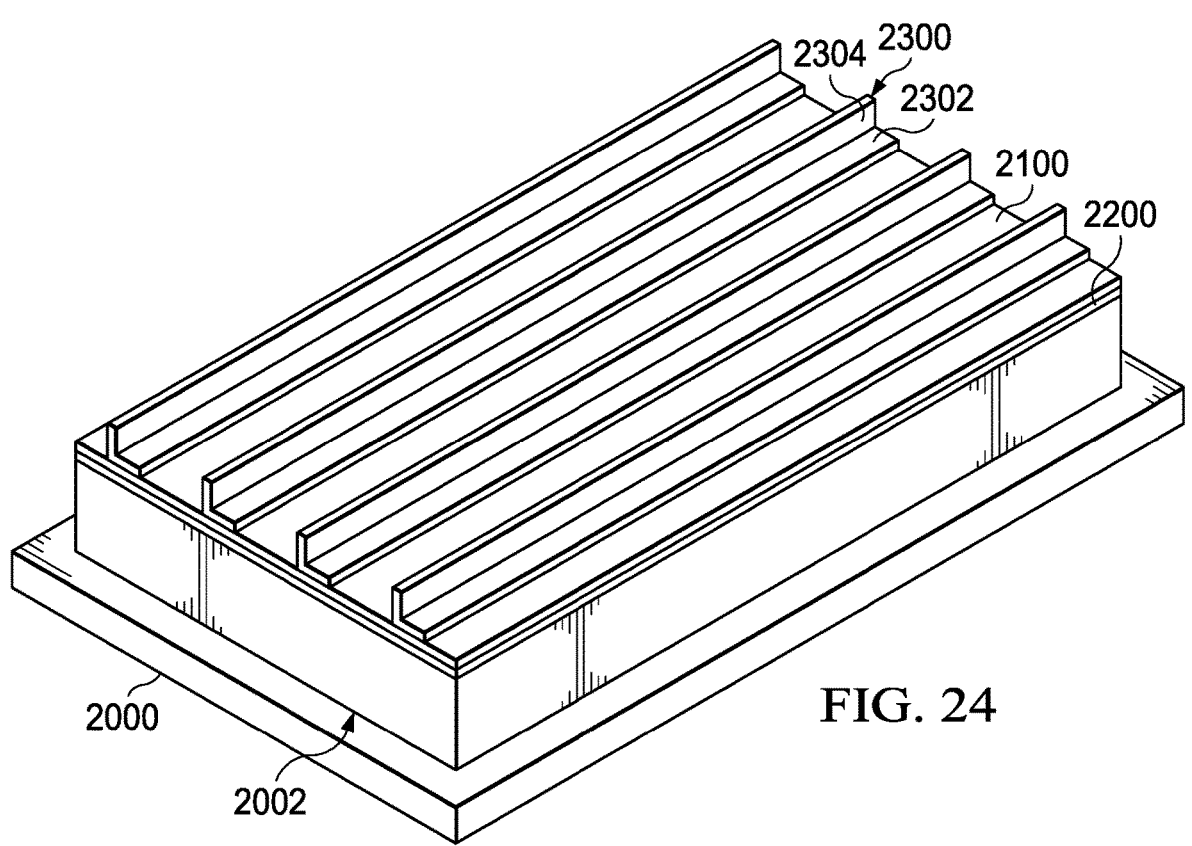

The method 3500 comprises coupling a second surface of the film to the top surface of the mold compound using the second adhesive, the film covering the multiple sensor cavities (3506). FIG. 24 is a perspective view of the structure of FIG. 23A coupled to the structure of FIG. 22A. Specifically, a bottom surface of the non-permeable film 2100 is coupled to the top surface of the mold compound 2002 using the adhesive 2200.

The method 3500 includes singulating the mold compound to produce a sensor package, the sensor package coupled to a portion of the film and to a portion of the compliant member (3508). FIG. 25A is a perspective view of a sensor package 2500 comprising the mold compound 2002 and having coupled thereto the non-permeable film 2100 and the compliant member 2300. The non-permeable film 2100 covers at least the sensor cavity 2004 and sensor 2006 of the sensor package 2500. FIG. 25B is a top-down view of the sensor package 2500, and FIG. 25C is a profile view of the sensor package 2500.

The method 3500 includes coupling the sensor package to a PCB (3510). The non-permeable film 2100 protects at least the sensor cavity 2004 and the sensor 2006 from debris, dust, pollution, corrosive substances, etc. during the PCB mounting process. After the sensor package 2500 has been coupled to a PCB, the method 3500 comprises using the portion of the compliant member to remove the portion of the film and the portion of the compliant member from the sensor package (3512). Thus, the portion 2304 may be grasped and pulled to remove both the compliant member 2300 and the non-permeable film 2100 from the sensor package 2500. Because the compliant member 2300 couples to the non-permeable film 2100 using a stronger adhesive than the adhesive used to couple the non-permeable film 2100 to the mold compound 2002, pulling on the compliant member 2300 causes both the compliant member 2300 and the non-permeable film 2100 to detach from the sensor package 2500. The considerations described above for the adhesive 1002 (e.g., width of adhesive, alignment of adhesive with reference to rows of semiconductor dies) with reference to FIGS. 8A-19B and 34 apply to the adhesive used to couple the compliant member 2300 to the non-permeable film 2100, and thus are not repeated here. In examples, the compliant member 2300 has a stiffness ranging from 0.2 Gigapascals (GPa) to 3 GPa. A stiffer compliant member 2300 may fail to adequately mitigate mechanical stress and may increase the possibility of damage during the removal process, while a less stiff compliant member 2300 may provide inadequate grip during the removal process.

FIGS. 26A-32 are perspective, profile, top-down, and bottom-up views of another process flow for manufacturing a sensor package in accordance with various examples. FIG. 36 is a flow diagram of a method 3600 for manufacturing the sensor packages of FIGS. 26A-32 in accordance with various examples. Accordingly, FIGS. 26A-32 and 36 are now described in tandem.

Figure 26B:
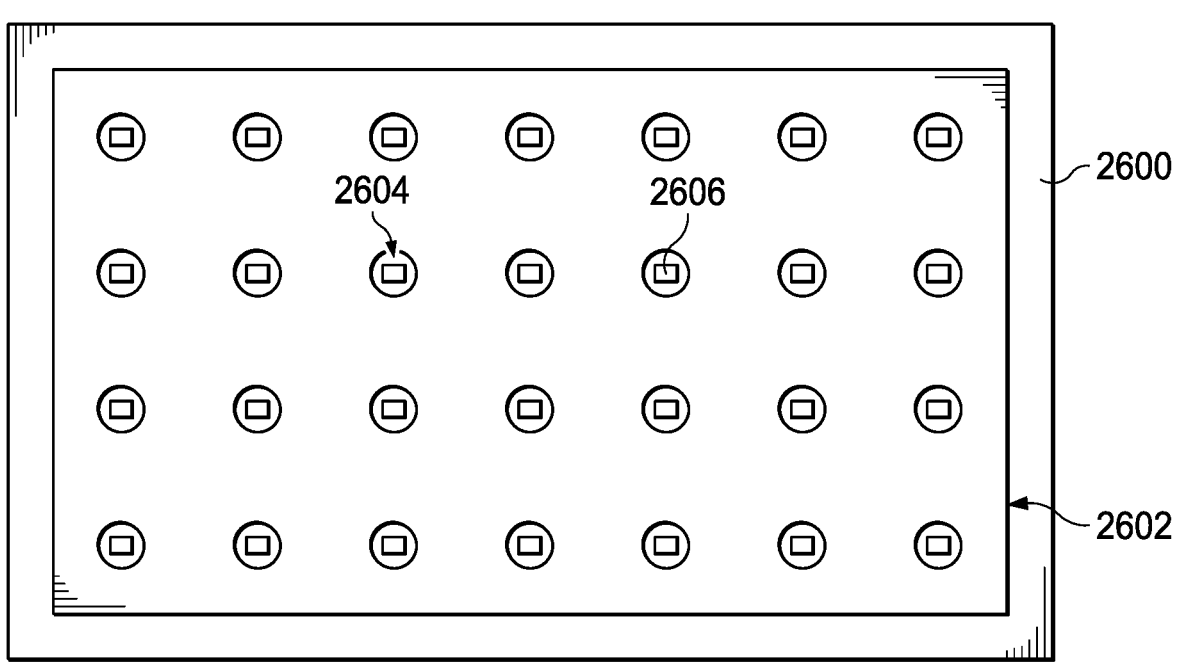
FIGS. 26A-32 are perspective, profile, top-down, and bottom-up views of another process flow for manufacturing a sensor package in accordance with various examples.
Figure 27:
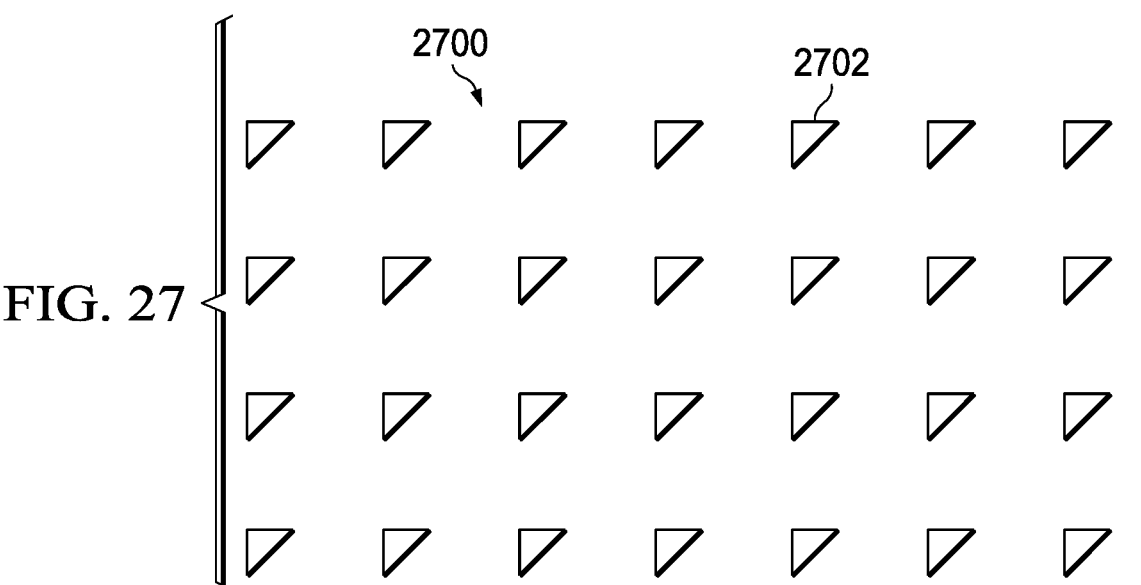
Figure 28A:
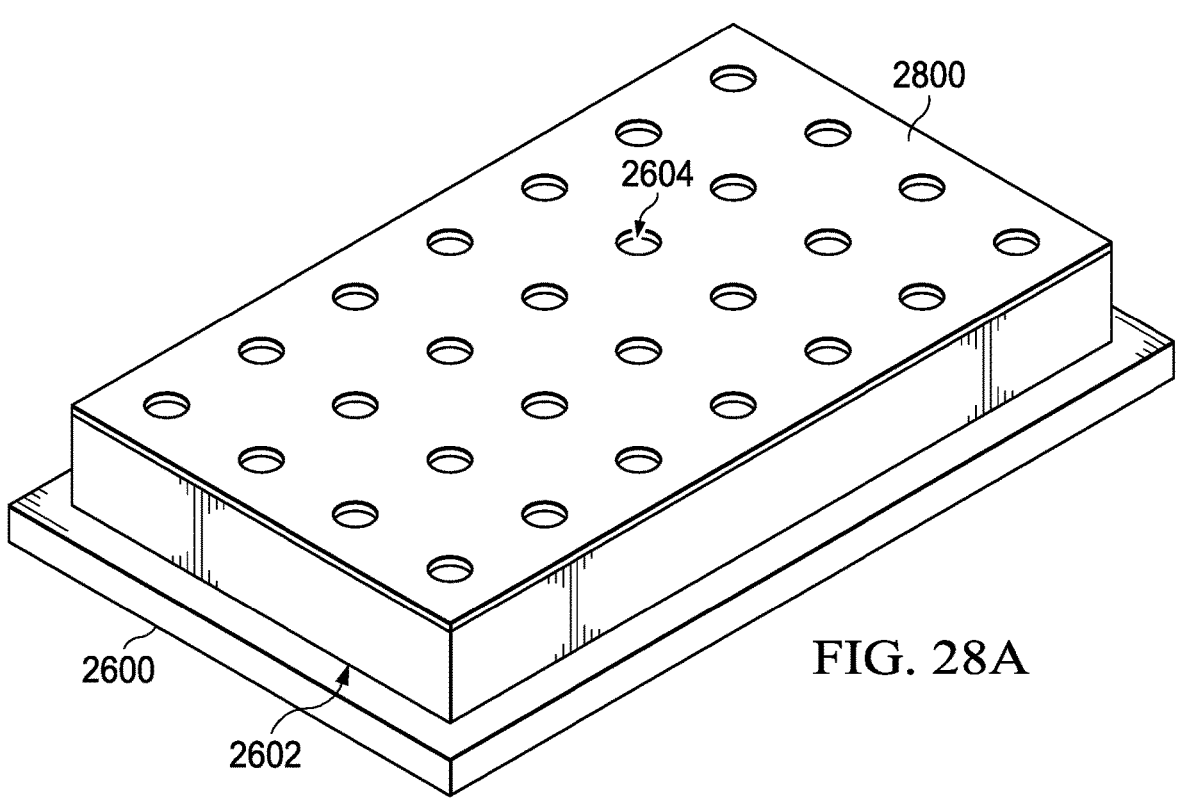
Figure 28B:
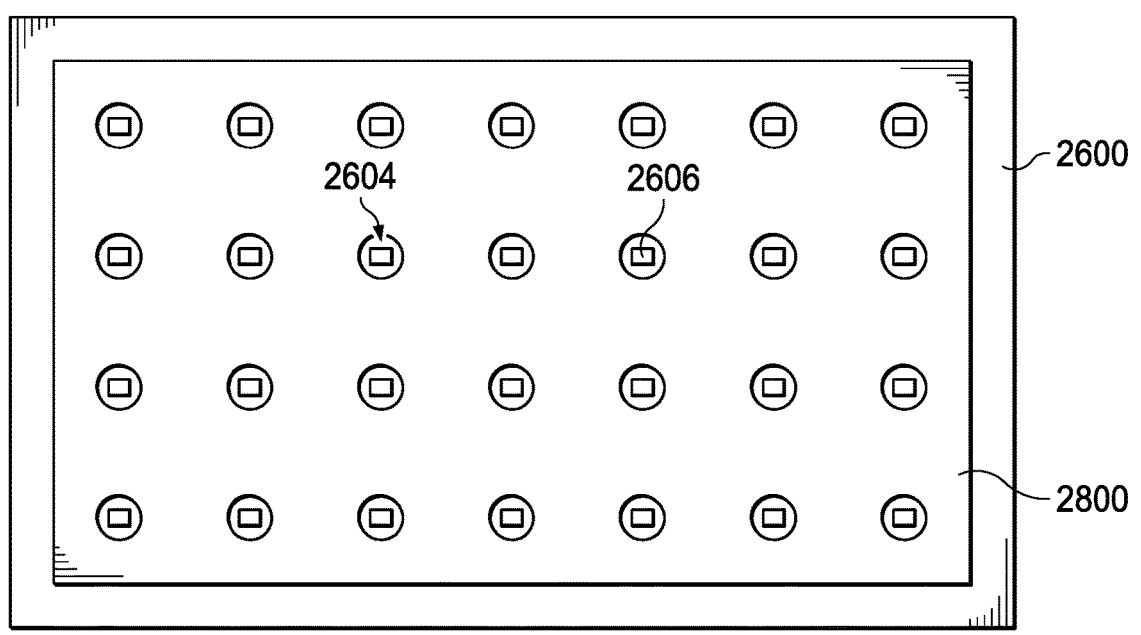
Figure 29A:
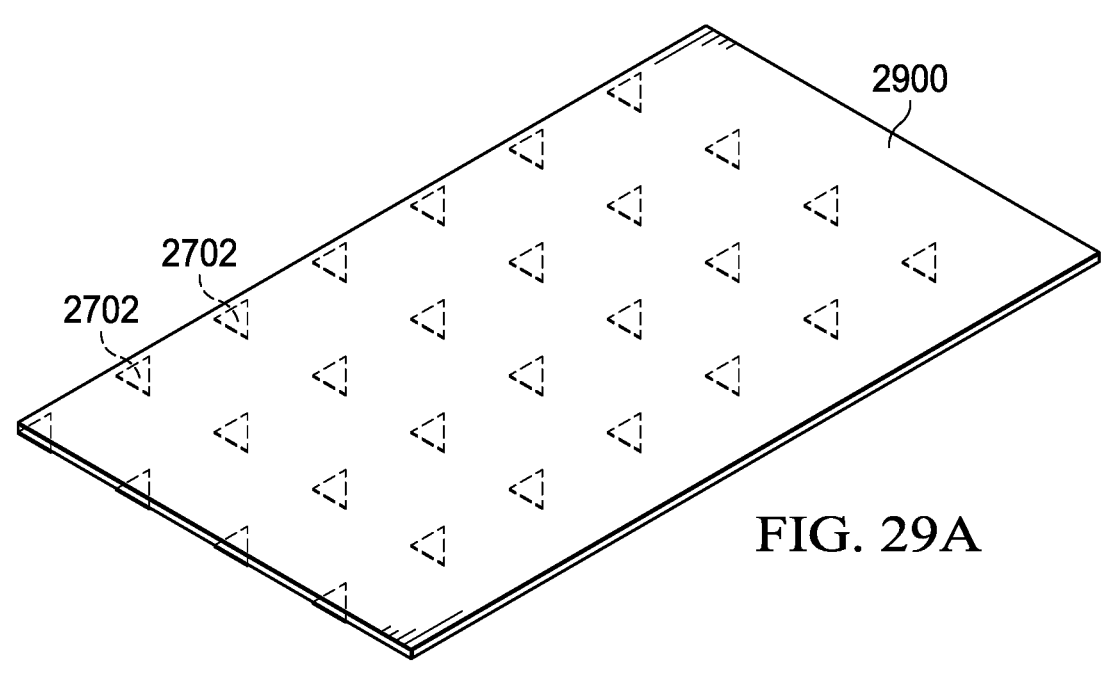
Figure 29B:
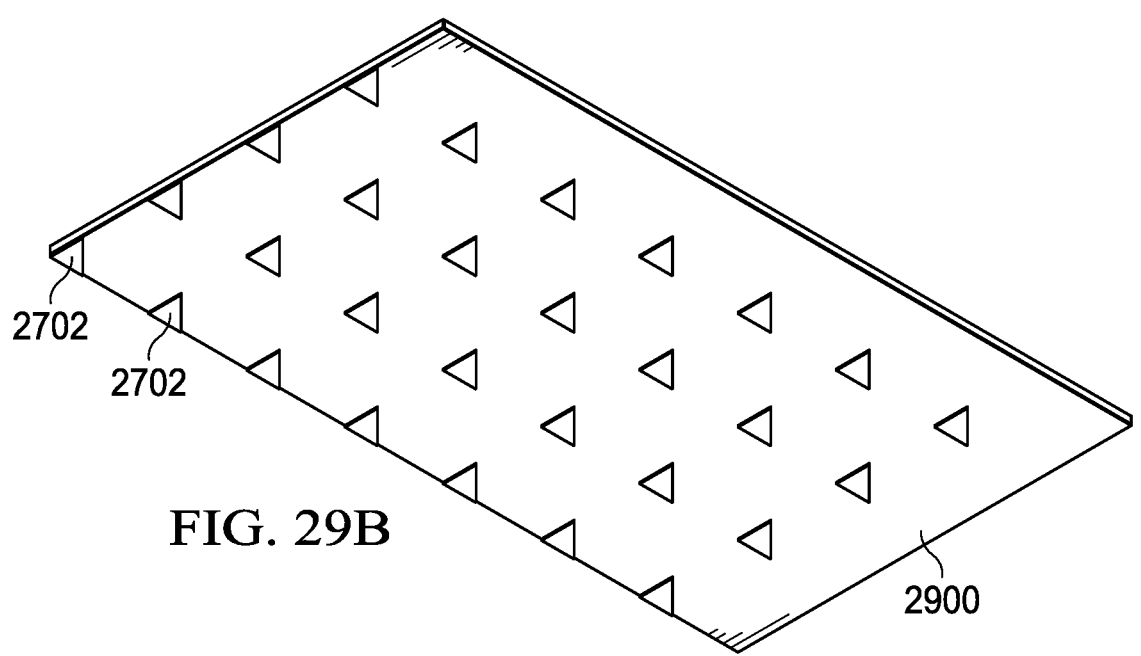

The method 3600 includes coupling multiple flags to a first surface of a film (3602). The method 3600 also includes applying an adhesive to a top surface of a mold compound (3604). The mold compound covers multiple semiconductor dies and includes multiple sensor cavities in the top surface of the mold compound, with each of the multiple sensor cavities vertically aligned with a sensor of a corresponding one of the multiple semiconductor dies (3604). FIG. 26A is a perspective view of a structure that is the same as the structures of FIG. 1A, with numerals 2600, 2602, and 2604 corresponding to numerals 100, 102, and 104, respectively. FIG. 26B is a top-down view of the structure of FIG. 26A, with sensors 2606 inside the sensor cavities 2604. The sensors 2606 are the same as the sensors 106 shown in FIG. 1B. FIG. 27 is a top-down view of a carrier 2700 (e.g., a paper carrier) having positioned thereupon multiple flags 2702 (composed of, e.g., wax paper or PTFE). In examples, the flags 2702 have a triangular shape, for instance when the flags 2702 are intended for subsequent positioning in a corner of a top surface of a sensor package, as described below. However, other shapes are contemplated and included in the scope of this disclosure, such as rectangles, semi-rectangles, semi-circles, etc. Such shapes may be better suited to placement in areas other than corners of the top surfaces of sensor packages, and, consequently, flags 2702 with such shapes may be positioned differently on the carrier 2700. The flags 2702 may be sticky (or have an adhesive applied) on one surface, for example, the surface facing away (not touching) the carrier 2700. In examples, an adhesive strength of the flags 2702 may range from 0.88 N/mm² and 1.81 N/mm², with some examples having a minimum adhesive strength of 1.2 N/mm2. An adhesive strength below these ranges may produce insufficient adhesion to prevent detachment of the flags 2702, while an adhesive strength above these ranges may be unnecessarily expensive or cumbersome to use during manufacture. FIG. 28A is a perspective view of the structure of FIG. 26A, but with the addition of an adhesive 2800. In examples, the adhesive 2800 corresponds to the adhesive 300 described above. FIG. 28B is a top-down view of the structure of FIG. 28A. FIG. 29A is a perspective, top-down view of a non-permeable film 2900, which is the same as the non-permeable film 2100 described above, both without and with the flags 2702 coupled thereto. In examples, the flags 2702 are coupled to the non-permeable film 2900 by laying the non-permeable film 2100 on top of the carrier 2700, thus causing the sticky flags 2702 to couple to the non-permeable film 2900 as shown. FIG. 29B is a perspective, bottom-up view of the structures of FIG. 29A.

Figure 30A:
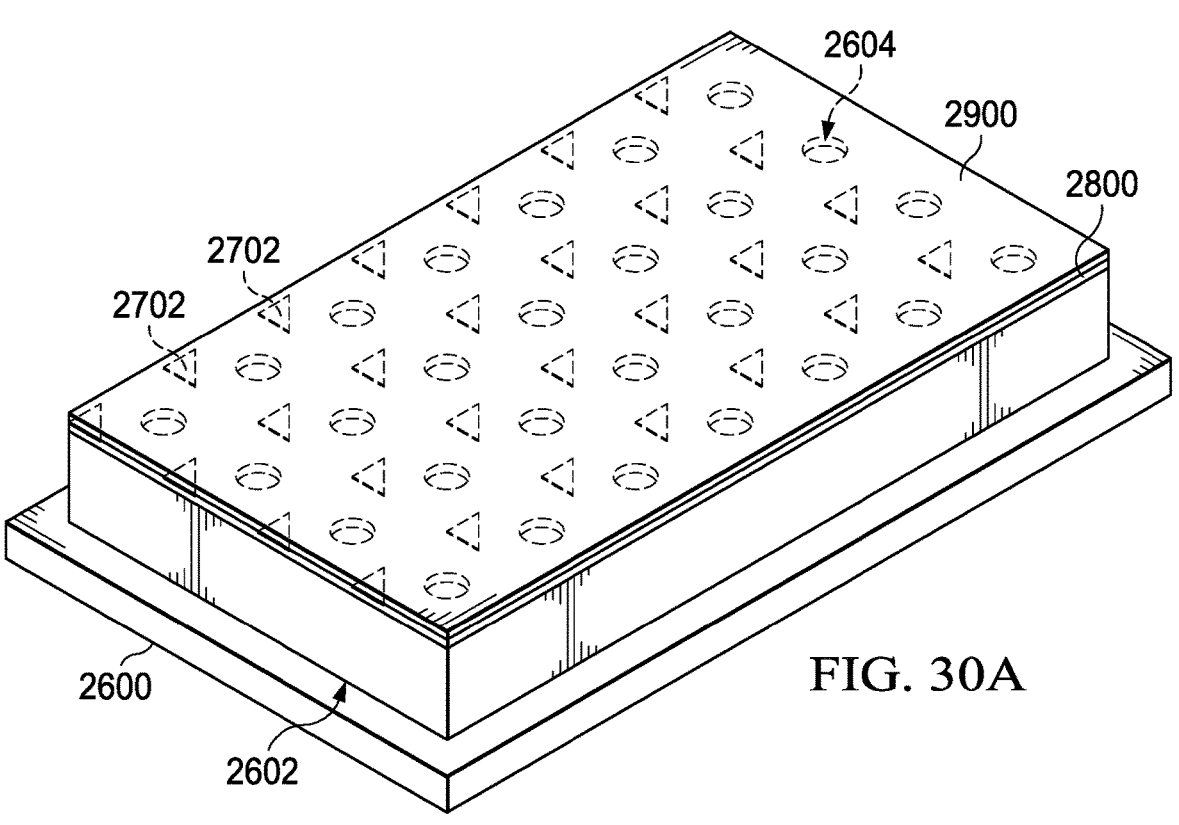
Figure 30B:
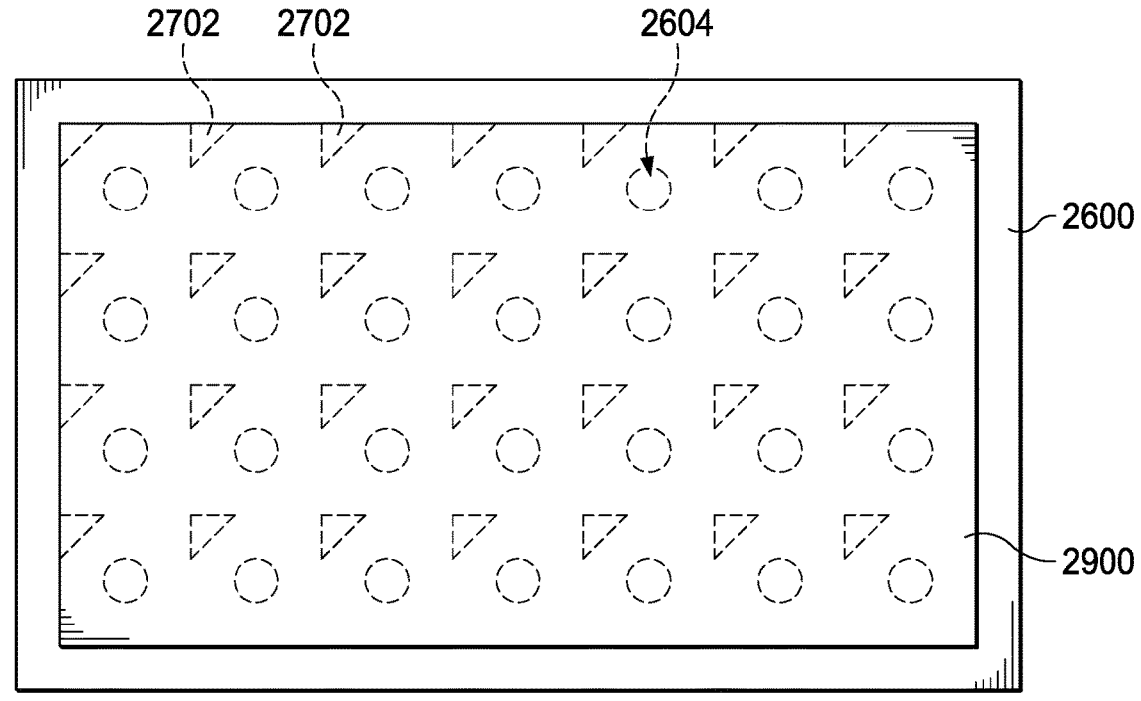

The method 3600 includes coupling the multiple flags and the first surface of the film to the top surface of the mold compound using the adhesive, where the film covers the multiple sensor cavities (3606). FIG. 30A is a perspective view of the structure of FIG. 29A (including the flags 2702) coupled to the structure of FIG. 28A. As shown, the non-permeable film 2900 covers the sensor cavities 2604 and the sensors 2606 inside the sensor cavities 2604. FIG. 30B is a top-down view of the structure of FIG. 30A.

Figure 31A:
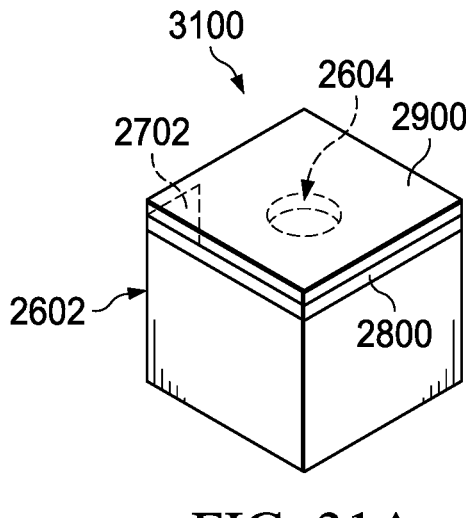
Figure 31B:
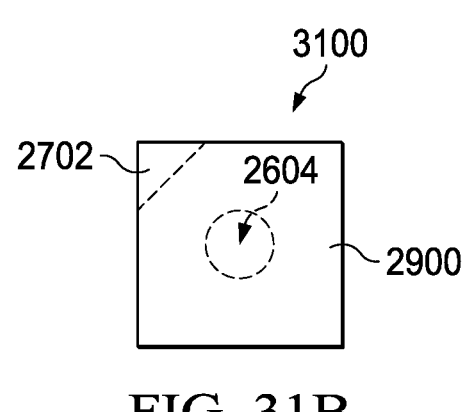

The method 3600 includes singulating the mold compound to produce a sensor package, where the sensor package is coupled to one of the multiple flags and to a portion of the film (3608). FIG. 31A is a perspective view of a sensor package 3100 having the non-permeable film 2900 coupled to a top surface of the sensor package 3100 using the adhesive 2800. A flag 2702 is positioned in a corner of the top surface of the sensor package 3100, as shown. FIG. 31B is a top-down view of the structure of FIG. 31A.

Figure 32:
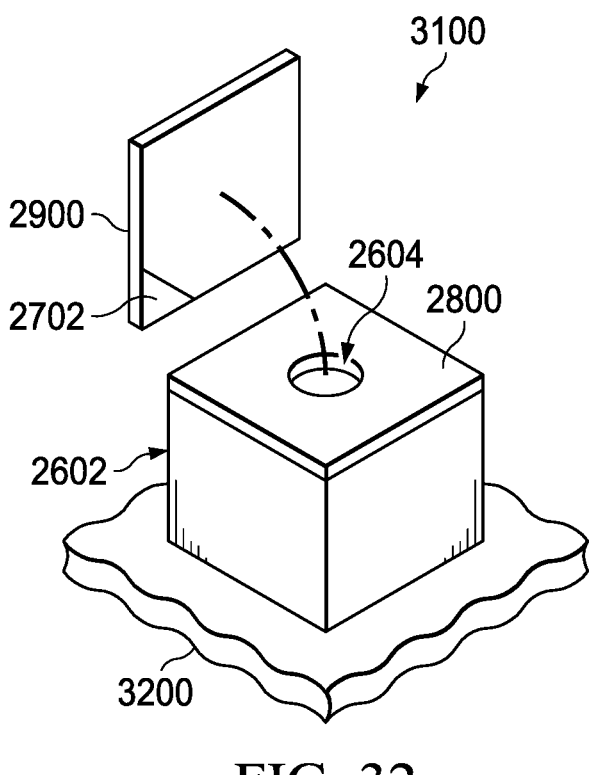

The method 3600 includes coupling the sensor package to a PCB (3610) and using the one of the multiple flags to remove the portion of the film from the sensor package (3612). FIG. 32 is a perspective view of the sensor package 3100 coupled to a PCB 3200, with conductive terminals, solder connections, etc. omitted for clarity and ease of explanation. The mounting of the sensor package 3100 may expose the sensor 2606 to dust, debris, pollution, corrosive substances, but the non-permeable film 2900 covers and thus protects the sensor 2606 and the sensor cavity 2604 from such harmful exposures. After the sensor package 3100 is coupled to the PCB 3200, however, the flag 2702 may be used to remove both the flag 2702 and the non-permeable film 2900 from the sensor package 3100, as shown. Specifically, the flag 2702 may be used to remove the flag 2702 and the non-permeable film 2900 because it is less firmly coupled to the adhesive 2800 than the non-permeable film 2900. As a result, the flag 2702 is lifted off of the adhesive 2800 with relative ease, and the flag 2702 may then be grasped and pulled (e.g., by hand or a pick-and-place tool) to remove both the flag 2702 and the non-permeable film 2900 from the sensor package 3100.

In examples, the flag 2702 is sized to be large enough so that it can be grasped with relative ease. Conversely, the flag 2702 should not be so large that an adhesive seal does not form between the flag 2702 and the sensor cavity 2604. On the contrary, a seal is desirable between the flag 2702 and the sensor cavity 2604 so that there are no vulnerable ingress points for dust, debris, pollution, corrosive substances, etc. to enter the sensor cavity 2604 and damage the sensor 2606. Accordingly, in some examples, the flag 2702 has an area approximately equivalent to the horizontal cross-sectional area of the sensor cavity 2604. In some examples, an area of the flag 2702 ranges from 0.5 mm² to 1 mm². In some examples, to ensure an adequate seal between the flag 2702 and the sensor cavity 2604, the shortest distance between the flag 2702 and the sensor cavity 2604 is at least 1 mm.

In addition, the flag 2702 should be aligned with an edge of a top surface of the sensor package 3100. Otherwise, the flag 2702 will be of diminished use in lifting the non-permeable film 2900 off of the sensor package 3100, or in some cases, portions of non-permeable film 2900 may become attached to the sensor package 3100 without also being coupled to the flag 2702, making such portions of non-permeable film 2900 difficult to remove from the sensor package 3100. Thus, care should be taken to facilitate proper alignment of the flag 2702 with the edge of the top surface of the sensor package 3100. In the event that a relatively small degree of misalignment is still present after the non-permeable film 2900 has been coupled to the mold compound 2602, the singulation process may be adjusted to ensure that the flags 2702, post-singulation, are present on the edges of the top surfaces of the sensor packages 3100.

In general, each of the example methods described above produces a film that covers at least a sensor cavity of a sensor package or, in examples, an entire top surface of a sensor package. Because these films protect from exposure to debris, dust, pollution, corrosive substances, etc., removal of the films after PCB mounting reveals areas of the sensor packages that are free of damage from such exposure. In examples, the areas of the sensor packages free of damage from such exposure are commensurate with the coverage provided by the corresponding films. Thus, in examples where a film covers an entire top surface of a sensor package, the entire top surface of the sensor package may be free from evidence of exposure to damaging substances. Such an area that is free from damage due to corrosive and other harmful substances may be approximately flush with one, two, three, four, or more edges of the top surface of the sensor package. Such flush alignment with the edges of the top surface of the sensor package are possible with the methods described herein because the bounds of film protection are determined by the singulation process and not by the ability of a human to accurately and precisely position a protective film on a sensor package. Other patterns evidencing protection from damaging substances are possible and are included in the scope of this disclosure.

In the foregoing discussion and in the claims, the terms "including" and "comprising" are used in an open-ended fashion, and thus mean "including, but not limited to . . . " Also, the term "couple" or "couples" means either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Unless otherwise stated, "about," "approximately," or "substantially" preceding a value means +/−10 percent of the stated value.

The above discussion is illustrative of the principles and various examples of the present disclosure. Numerous variations and modifications will become apparent to those skilled in the art once the above disclosure is fully appreciated. The following claims should be interpreted to embrace all such variations and modifications.

What is claimed is:

1. A semiconductor package, comprising:
a semiconductor die including a sensor;
a mold compound covering a portion of the semiconductor die;
a cavity formed through the mold compound over the sensor;
an adhesive layer disposed over the mold compound; and
a film disposed over the adhesive layer, wherein the film includes an orifice at a corner of a top surface of the semiconductor package.

2. The semiconductor package of claim 1, wherein the adhesive layer includes at least one edge that is flush with at least one edge of the mold compound.

3. The semiconductor package of claim 1, further comprising:
a second cavity formed through the adhesive layer over the sensor.

4. The semiconductor package of claim 1, further comprising:
a second cavity formed through the adhesive layer, wherein the second cavity is aligned with the cavity.

5. The semiconductor package of claim 1, wherein a corner of a top surface of the adhesive layer is exposed to an exterior of the semiconductor package.

6. The semiconductor package of claim 1, wherein the film includes at least one edge that is flush with at least one edge of the mold compound.

7. The semiconductor package of claim 1, wherein the film is a semi-permeable film.

8. The semiconductor package of claim 7, wherein the semi-permeable film covers the cavity.

9. The semiconductor package of claim 1, wherein the semiconductor package is a quad flat no-lead (QFN) style sensor package.

10. A semiconductor package, comprising:
a semiconductor die including a sensor;
a mold compound covering at least a portion of the semiconductor die;
a first cavity extending through the mold compound over the sensor;
an adhesive layer disposed over the mold compound;
a second cavity extending through the adhesive layer, the second cavity is aligned with the first cavity; and
a film disposed over the adhesive layer, wherein the film includes an orifice at a corner of a top surface of the semiconductor package.

11. The semiconductor package of claim 10, wherein the adhesive layer includes at least one edge that is flush with at least one edge of the mold compound.

12. The semiconductor package of claim 10, wherein a corner of a top surface of the adhesive layer is exposed to an exterior of the semiconductor package.

13. The semiconductor package of claim 10, wherein the film includes at least one edge that is flush with at least one edge of the mold compound.

14. The semiconductor package of claim 10, wherein the film is a semi-permeable film that covers the first cavity and the second cavity.

15. The semiconductor package of claim 10, wherein the semiconductor package is a quad flat no-lead (QFN) style sensor package.

\* \* \* \* \*